United States Patent
Fujishiro

(10) Patent No.: US 12,327,746 B2
(45) Date of Patent: Jun. 10, 2025

(54) FOUP TRANSFER DEVICE

(71) Applicant: Rorze Corporation, Hiroshima (JP)

(72) Inventor: Yoshiyuki Fujishiro, Ibara (JP)

(73) Assignee: Rorze Corporation (JP)

( * ) Notice: Subject to any disclaimer, the term of this patent is extended or adjusted under 35 U.S.C. 154(b) by 608 days.

(21) Appl. No.: 17/785,626

(22) PCT Filed: Dec. 3, 2020

(86) PCT No.: PCT/JP2020/045024
§ 371 (c)(1),
(2) Date: Jun. 15, 2022

(87) PCT Pub. No.: WO2021/145087
PCT Pub. Date: Jul. 22, 2021

(65) Prior Publication Data
US 2023/0010048 A1 Jan. 12, 2023

(30) Foreign Application Priority Data
Jan. 14, 2020 (JP) .................................. 2020-003681

(51) Int. Cl.
*H01L 21/677* (2006.01)
*H01L 21/68* (2006.01)

(52) U.S. Cl.
CPC .... *H01L 21/6773* (2013.01); *H01L 21/67727* (2013.01); *H01L 21/67733* (2013.01);
(Continued)

(58) Field of Classification Search
CPC ........... H01L 21/6773; H01L 21/67727; H01L 21/67733; H01L 21/67766; H01L 21/681;
(Continued)

(56) References Cited

U.S. PATENT DOCUMENTS

| 7,578,650 B2 * | 8/2009 | Aalund ............. H01L 21/67775 414/217 |
| 2002/0099470 A1 * | 7/2002 | Zinger ............. H01L 21/67757 700/228 |

(Continued)

FOREIGN PATENT DOCUMENTS

| JP | 4182521 | 11/2008 |
| JP | 2013-16665 | 1/2013 |

(Continued)

OTHER PUBLICATIONS

International Search Report dated Jan. 26, 2021 issued in connection with International Application No. PCT/JP2020/045024, 2 pages.

*Primary Examiner* — Michael Collins
(74) *Attorney, Agent, or Firm* — Merek, Blackmon & Voorhees, LLC

(57) ABSTRACT

Provided is a FOUP transfer device for transferring FOUPs between load ports and which is capable of reducing remodeling work on a pre-installed conveyance device as much as possible. FOUP transfer devices 1-1, 1-2 are installed in the vicinity of the load ports of the conveyance device, comprising one or more load ports 18-1, 18-2, and transfer FOUPs 3 between the load ports 18-1, 18-2. The FOUP transfer devices 1-1, 1-2 have first optical I/O communication devices 31-3, 31-4 and are configured such that second optical I/O communication devices 31-1, 31-2 provided for the load ports 18-1, 18-2 are connected thereto, and so as to carry out, in place of the load ports 18-1, 18-2, the optical I/O communication carried out between the load ports 18-1, 18-2 and an OHT cart 11.

20 Claims, 18 Drawing Sheets

(52) U.S. Cl.
CPC ...... *H01L 21/67766* (2013.01); *H01L 21/681* (2013.01); *H01L 21/67769* (2013.01)

(58) Field of Classification Search
CPC ......... H01L 21/67769; H01L 21/67736; H01L 21/67775; B65G 1/0457; B65G 1/1378; B65G 2201/0297
See application file for complete search history.

(56) References Cited

U.S. PATENT DOCUMENTS

| | | |
|---|---|---|
| 2005/0036856 A1 | 2/2005 | Yamashita |
| 2016/0130083 A1* | 5/2016 | Abe ................... B65G 1/0407 414/276 |
| 2016/0130084 A1* | 5/2016 | Omori ............... H01L 21/67769 700/218 |

FOREIGN PATENT DOCUMENTS

| | | |
|---|---|---|
| JP | 2014-160882 | 9/2014 |
| JP | 2018-142859 | 9/2018 |
| JP | 2019-4089 | 1/2019 |
| JP | 2019-153720 | 9/2019 |
| WO | 2017/098805 | 6/2017 |

\* cited by examiner

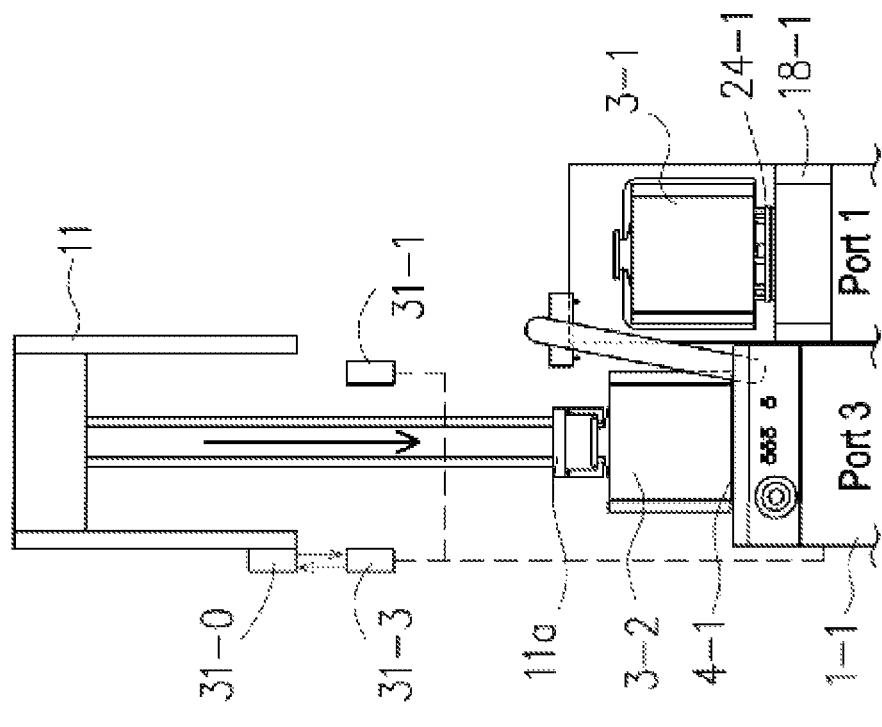
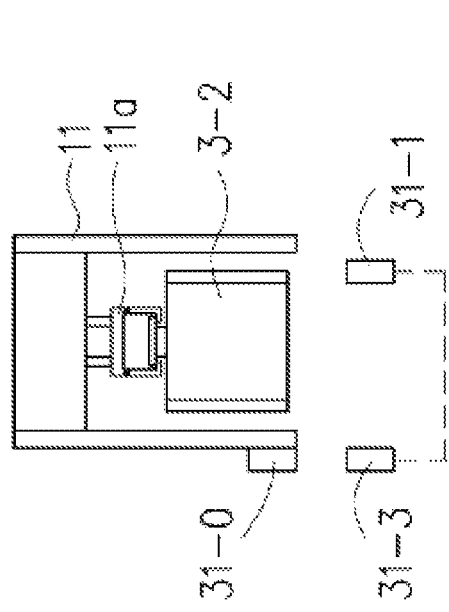

FIG. 11A
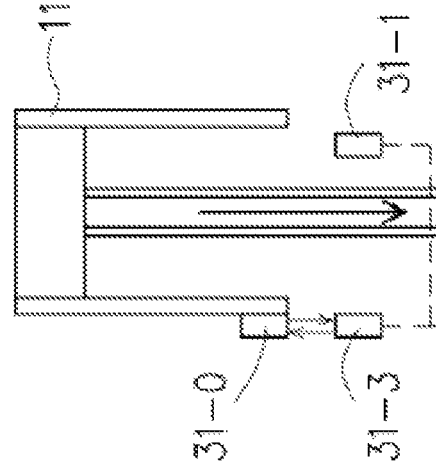
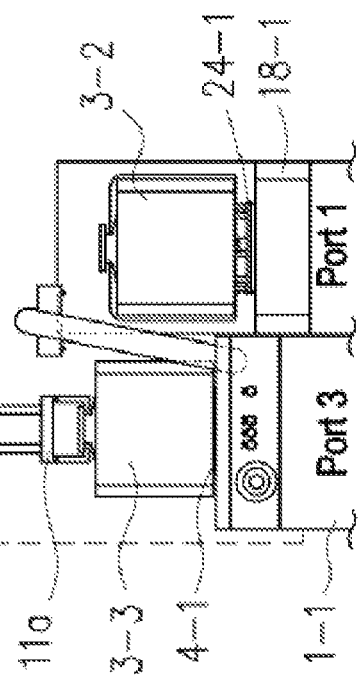
FIG. 11B
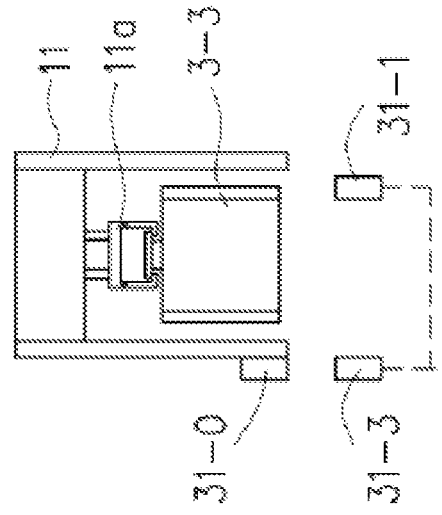
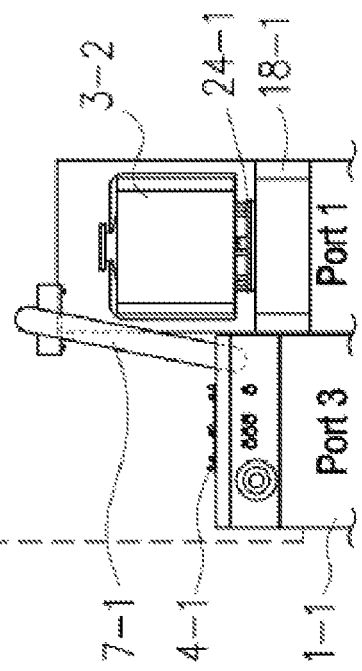

FIG. 14
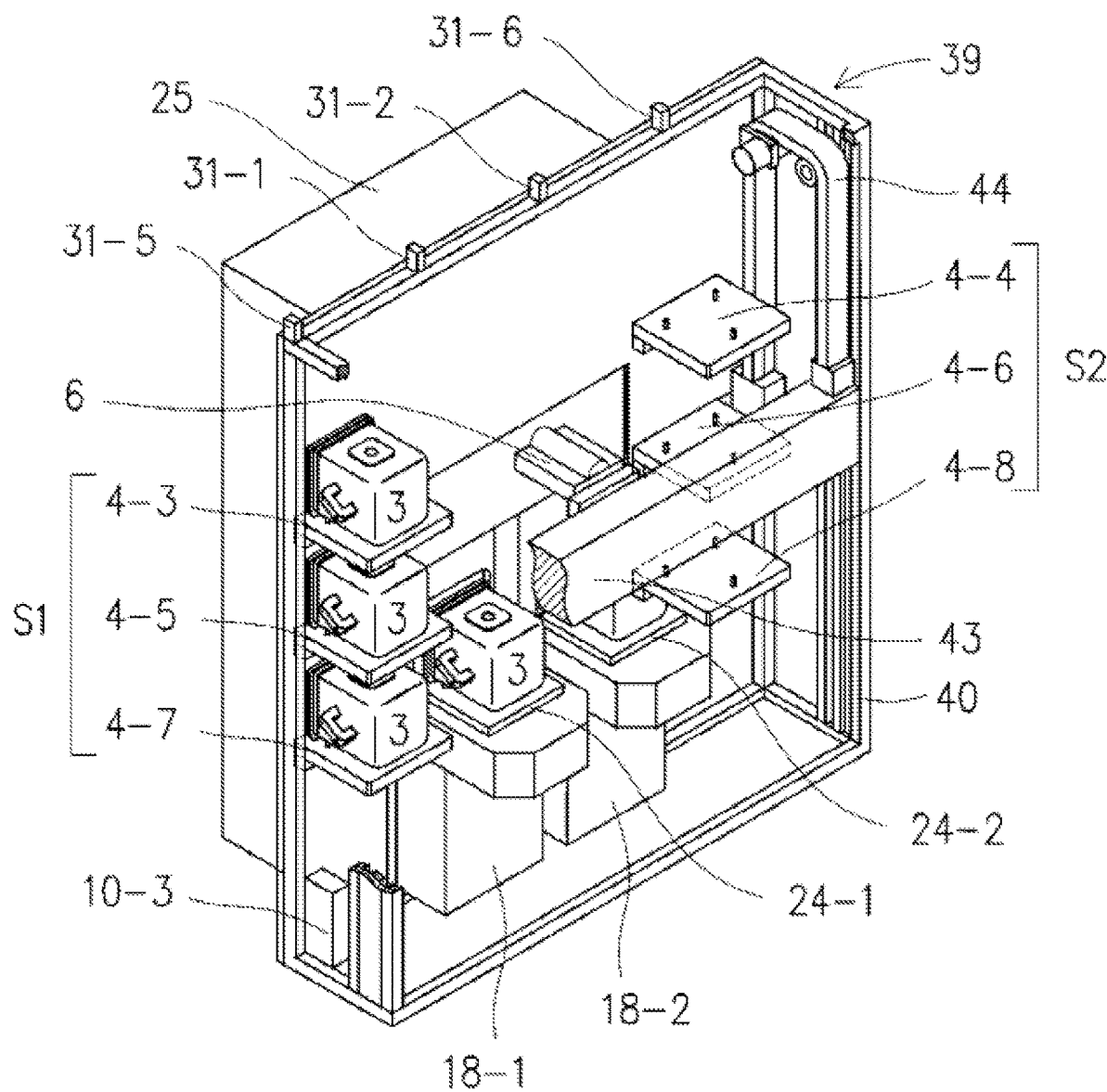
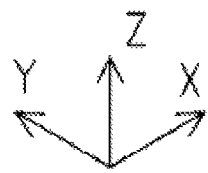

FOUP TRANSFER DEVICE

FIELD OF THE INVENTION

The present invention relates to a FOUP transfer device that is installed in the vicinity of a load port and transfers the FOUP to and from the load port.

Semiconductor chip manufacturing processes require many surface treatment processes and inspection processes, and in semiconductor manufacturing factories, a large number of dedicated processing devices for performing various surface treatments and inspections are arranged on the surface of a wafer, and the wafer is transported between the processing devices by an inter-process transport device in a state of being housed in a closed container called FOUP (Front-Opening Unified Pod). Each processing device is equipped with a conveyance device called EFEM (Equipment Front End Module) on the front end. This EFEM receives the FOUP transported by the inter-process transport device called OHT (Overhead Hoist Transport) or AGV (Automated Guided Vehicle), and thereafter, takes the wafer from the inside of the FOUP and transports the wafer to the next processing device. The EFEM is equipped with one or more open/close devices called load ports that mount the FOUP and open/close the FOUP door. The wafer that has been processed by the processing devices is transported to a different FOUP from the one in which the wafer was housed before processing. After the processing is completed, when the number of wafers transported from the processing devices reaches a predetermined number, the FOUP door is closed and the FOUP is transported to the next manufacturing process by OHT.

In general, there are a variety of processing processes performed by the processing devices and the inspection devices, and the time required to process a wafer varies greatly depending on the processing process. Even if one processing is completed, it is not always possible to transport the FOUP to the next manufacturing process immediately. Therefore, the semiconductor manufacturing factories temporarily store the FOUP in a stocker, and use an inter-process transport device to transport the FOUP to the processing device in a timely manner. The stocker is a device installed in a semiconductor manufacturing factory to store FOUPs on shelves that are equipped with dozens or hundreds of shelves or more. The stocker is provided with shelves for holding each FOUP and a FOUP conveyance robot that conveys the FOUP between the shelf and the inter-process transport device.

However, the OHT and AGV for transporting the FOUP can only travel in one direction on a track laid in the semiconductor manufacturing factory. Therefore, when the processing devices finish processing the wafer, the processing devices wait while the processing is stopped while waiting for the arrival of the OHT or AGV cart. The processing devices are expensive, and the occurrence of such non-operating time is a big negative in terms of production efficiency.

Therefore, for the purpose of shortening the non-operating time, Patent Document 1 provides a measure such as installing a temporary storage device for temporarily storing the FOUP in the vicinity of the EFEM to store a plurality of FOUPs containing unprocessed wafers, and then, exchanging the FOUP before the processing with the FOUP after the processing without any time when the processing process of the processing device is completed. However, in order to install a temporary storage device in the vicinity of the EFEM that has already been installed and is in operation in the factory, the processing devices must be stopped for a long time, during which the production capacity of the semiconductor manufacturing factory will be reduced. Further, since the temporary storage device stores and transports a plurality of FOUPs, it becomes relatively large and expensive, which leads to an increase in the production cost of the semiconductor.

Further, Patent Document 2 provides another means such as adding a FOUP transfer port to a 2-port type conveyance device having two load ports, and transferring the pre-processed FOUP stored by the FOUP transfer port onto the stage of the load port where the FOUP has been collected, thereby reducing the FOUP supply time to the load port. See FIG. 18. The FOUP transfer port is relatively simple in structure, low in cost, and has a small footprint, so that it is considered to be more cost-effective than the above-mentioned temporary storage device.

PRIOR ART

Patent Document

Patent Document 1: Japanese Patent No. 4182521
Patent Document 2: Japanese Patent Laid Open Publication No. 2014-160882

DISCLOSURE OF THE INVENTION

Problems to be Solved by the Invention

However, even if the FOUP transfer port is added, it is necessary to modify the load port and upgrade software that operates the conveyance device and software that communicates between the OHT and AGV. Therefore, the problem that the installation work is not completed in a short time has not been solved yet. The present invention has been devised in view of the above problem, and aims to provide a FOUP transfer device that transfers a FOUP to and from a load port and that requires as little modification as possible to the already installed transfer device.

Means to Solve the Problem

In order to achieve the above object, the FOUP transfer device of the present invention is installed in the vicinity of a load port of a conveyance device provided with one or more load ports, and transfers FOUP to and from the load port. The FOUP transfer device has a first communication device, and is further connected to a second communication device provided in the load port to perform communication between the load port and a third communication device provided in the load port and an OHT conveyance cart on behalf of the load port. With the above configuration, the FOUP transfer device can be installed without making major changes to the equipment in the semiconductor manufacturing factory.

Further, the FOUP transfer device of the present invention further includes a control PC that communicates with a host computer provided in the semiconductor manufacturing factory, so that the FOUP transfer device and the host computer can be communicated to each other via the control PC. Accordingly, it is possible to minimize changes in the conveyance device already installed in the semiconductor manufacturing factory.

Further, the FOUP transfer device of the present invention has a communication means for exchanging FOUP transfer signals with the load port, so that the OHT cart can supply and retrieve the FOUP to and from the load port, and it is possible to smoothly exchange the FOUP between the load port and the FOUP transfer device. Besides, it is desirable that the first communication device, the second communication device, and the third communication device are optical I/O communication devices. By using an optical I/O communication device, communication can be performed without being affected by noise generated from the processing device or the like.

Further, the FOUP transfer devices of the present invention are characterized in that arrangement of the FOUP transfer devices corresponds to the arrangement of the plurality of load ports included in the conveyance device, and the load ports and the FOUP transfer devices are arranged directly below the OHT track. With the above configuration, FOUP can be supplied to and retrieved from the FOUP transfer devices without changing the existing OHT track installed in the semiconductor manufacturing factory.

The FOUP transfer devices of the invention is also characterized by being located at a position that does not match the arrangement of the plurality of load ports arranged directly below the OHT track and directly below a second OHT track different from the OHT track. According to the above configuration, when the FOUP transfer device is installed in the semiconductor manufacturing factory where the second OHT track is installed, the FOUP transfer device is installed directly below the second OHT track. Accordingly, the FOUP can be supplied to and retrieved from the FOUP transfer device by an OHT track different from the OHT track that supplies and retrieves the FOUP to and from the load port, thereby making FOUP supply and retrieval more efficient.

Further, the FOUP transfer device of the invention is characterized by including a mounting table that mounts the FOUP at a predetermined position, a holding portion that holds the FOUP mounted on the mounting table, an arm portion that moves the holding portion in an arc-shaped trajectory, and an elevating mechanism that moves the arm portion up and down. According to the above configuration, the FOUP can be transferred with a simple structure.

Effects of the Invention

The FOUP transfer device of the present invention can be installed in the vicinity of the EFEM already installed in the semiconductor manufacturing factory in a short time, so that the productivity of the semiconductor manufacturing factory does not decrease during the installation work.

BRIEF DESCRIPTION OF THE DRAWINGS

FIG. 9A and FIG. 9B show an operation of the FOUP transfer device of the present embodiment.

FIG. 11A and FIG. 11B show an operation of the FOUP transfer device of the present embodiment.

FIG. 14 is a perspective view showing the FOUP transfer device according to an embodiment of the present invention.

MODE FOR CARRYING OUT THE INVENTION

Figure 1:
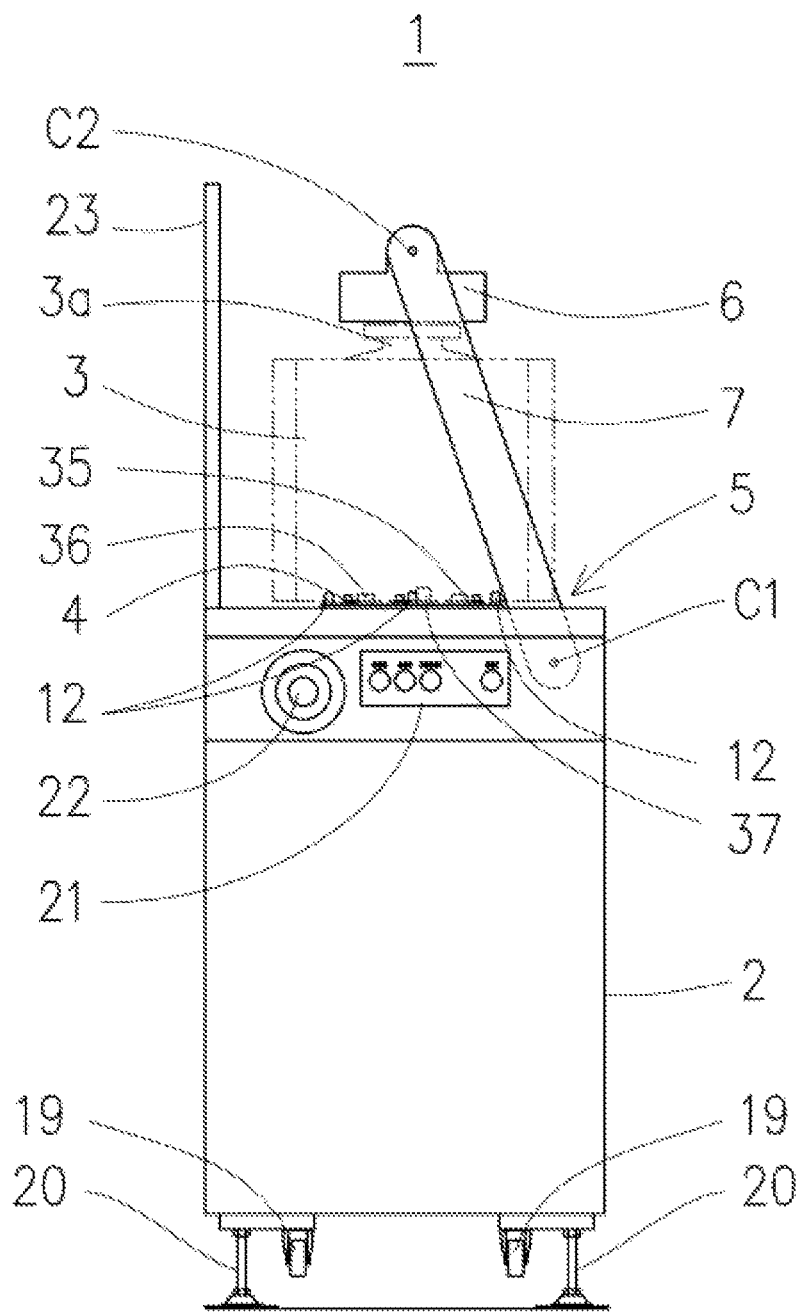
FIG. 1 is a front view showing a FOUP transfer device according to an embodiment of the present invention.
Figure 2:
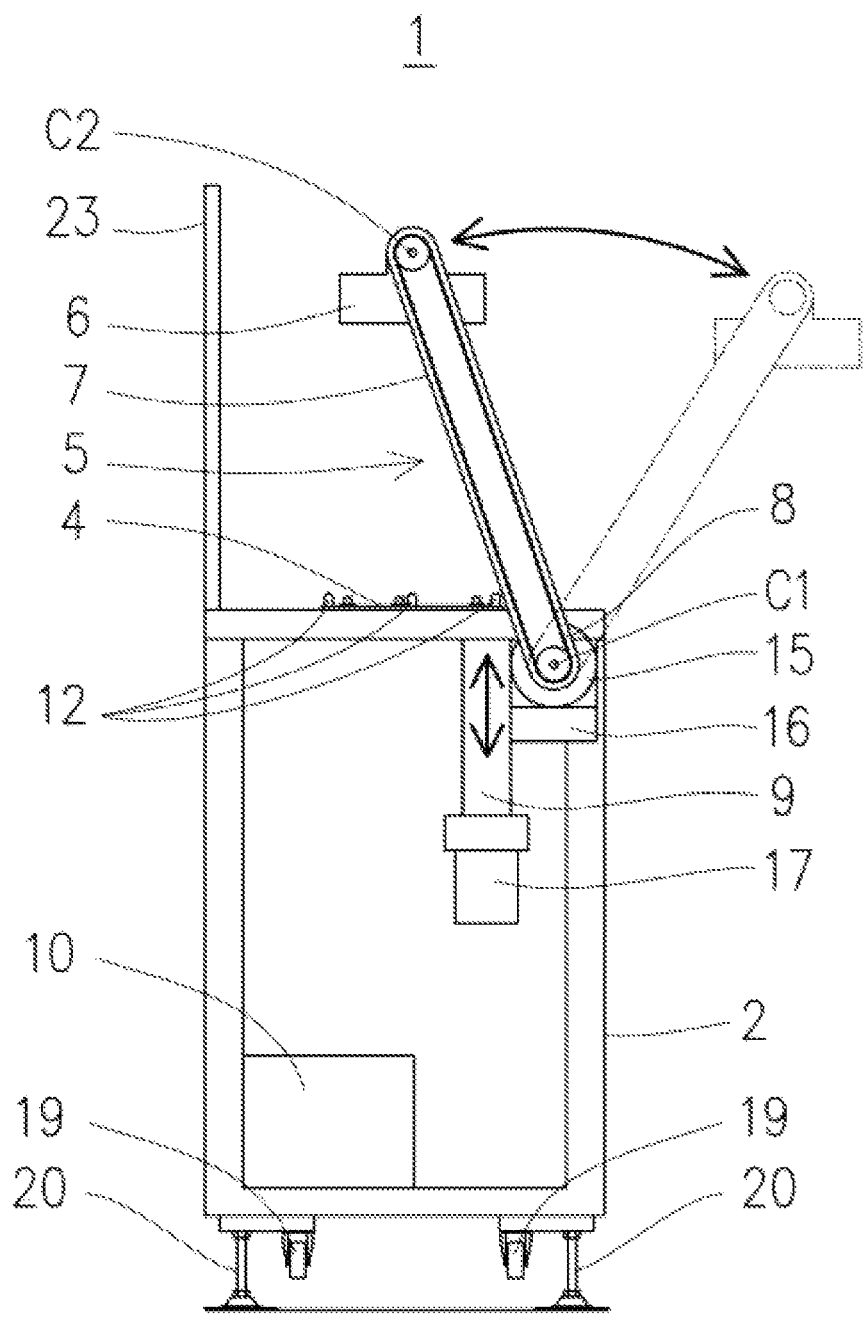
FIG. 2 is a cross-sectional view showing a FOUP transfer device according to an embodiment of the present invention.
Figure 3A:
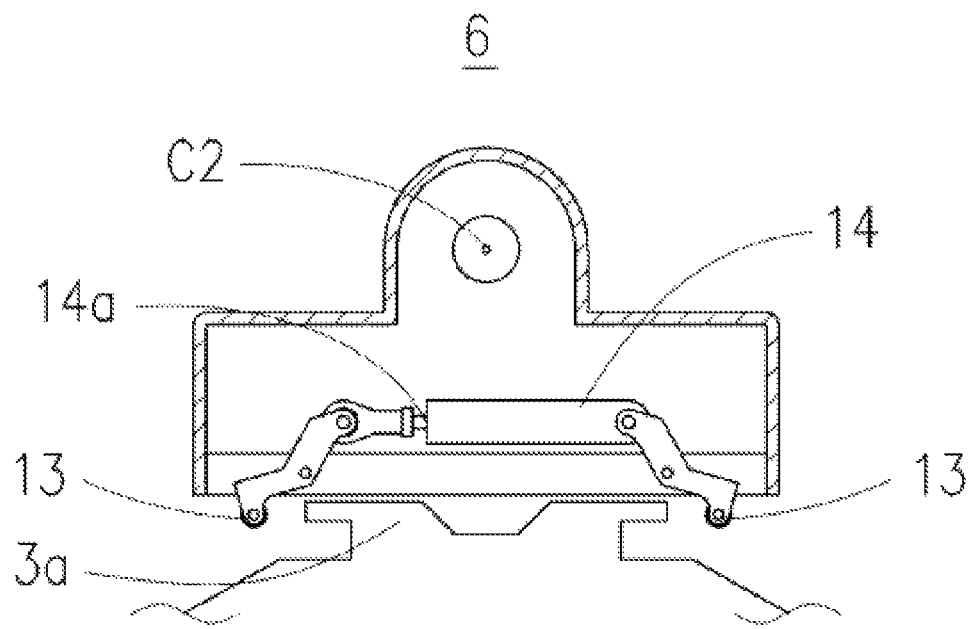
FIG. 3A and FIG. 3B are cross-sectional views showing a holding portion included in the FOUP transfer device according to the embodiment of the present invention.
Figure 3B:
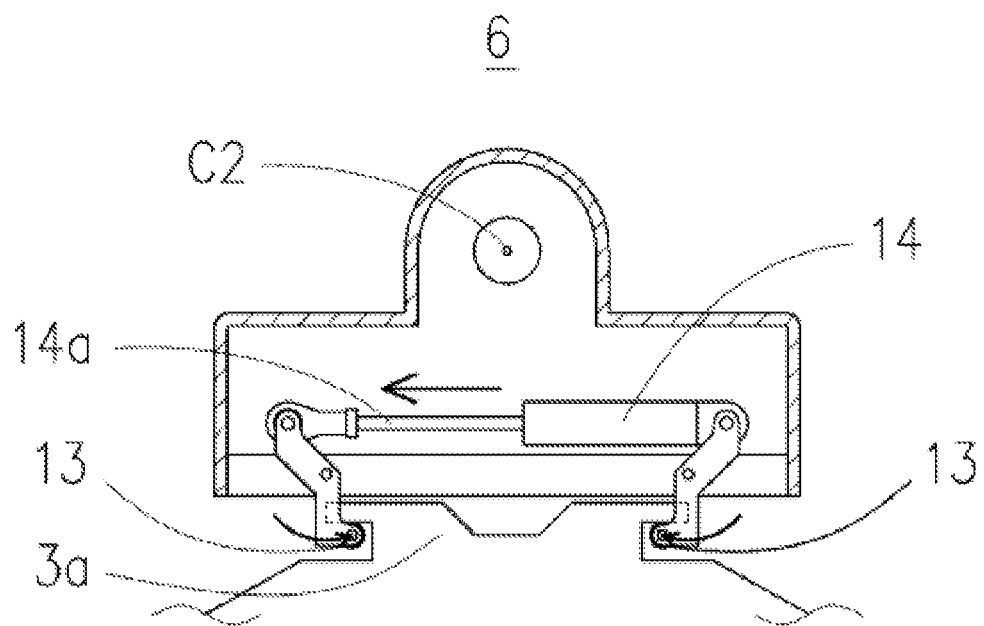

Hereinafter, embodiments of the present invention will be described in detail with reference to the drawings. FIG. 1 is a front view showing a FOUP transfer device 1 of an embodiment of the present invention, and FIG. 2 is a cross-sectional view thereof. FIG. 3A and FIG. 3B are cross-sectional views showing a holding portion 6 included in the FOUP transfer device 1. The FOUP transfer device 1 of the present embodiment includes a substantially rectangular parallelepiped housing 2, a mounting table 4 fixed to the top of the housing 2 on which a FOUP 3 is mounted, and a FOUP transfer mechanism 5. The FOUP transfer mechanism 5 consists of at least a holding portion 6 that holds a top flange 3a of the FOUP 3, an arm portion 7 that supports the holding portion 6 and moves it in an arc-shaped trajectory, an arm drive mechanism 8 that drives the arm portion 7, and an elevating mechanism 9 that moves the arm portion 7 and the arm drive mechanism 8 up and down. Further, a holding mechanism provided by the holding portion, the arm drive mechanism 8, and the elevating mechanism 9 are provided with driving sources 15 and 17, and the operation of these driving sources 15 and 17 is controlled by a control unit 10 included in the FOUP transfer device 1. Besides, the control unit 10 includes, in addition to the operation control of the driving sources 15 and 17 provided in the FOUP transfer mechanism 5 described above, a communication means for communicating with an AGV and a conveyance cart 11 of an OHT 26 shown in FIG. 5.

Three FOUP support pins 12 are erected on the top of the mounting table 4. When the FOUP 3 is mounted on these support pins 12, three grooves formed in predetermined positions on the bottom of the FOUP 3 come in contact with the top of the corresponding support pins 12, and thereby, the FOUP 3 is positioned at the predetermined position on the mounting table 4 to be mounted. The holding portion 6 is provided with a pair of left and right FOUP support members 13 that support a top flange 3a of the FOUP 3 from below, and an air cylinder that moves the pair of FOUP support members 13 between a holding position (closed position) and a release position (open position). When compressed air is supplied to an air cylinder 14, a piston rod 14a of the air cylinder 14 protrudes and moves from the main body of the air cylinder 14, and the pair of FOUP support members 13 move to the holding position (closed position). Further, when the compressed air supplied to the air cylinder 14 is exhausted, the piston rod 14a moves back into the main body of the air cylinder 14, and the pair of support members 13 move to the release position (open position). Further, the top of the holding portion 6 is rotatably connected to the tip of the arm portion 7.

A base end of the arm portion 7 is connected to an output shaft of the stepping motor 15 provided by the arm drive mechanism 8 via a reduction gear. With the above configuration, the output shaft of the stepping motor 15 of the arm drive mechanism 8 rotates forward and reverse, causing the arm portion 7 to swing around a rotation axis C1. The rotation axis C1 of the arm portion 7 and a rotation axis C2 of the holding portion 6 are connected by gears and belts with a one-to-one rotation ratio, so even if the arm portion 7 moves in a swinging motion, the holding portion 6 remains in a constant posture with the FOUP support member 13 down.

Further, the arm portion 7 is fixed on an elevating table 16, and the elevating table 16 is configured to be moved up and down in a vertical direction by the elevating mechanism 9. The elevating mechanism 9 includes an elevating table 16 that supports the arm portion 7 and the arm drive mechanism 8, a linear actuator 17 that guides a mover connected to the elevating table 16 in the vertical direction to move the elevating table 16 up and down, and a stepping motor 15 that is a driving source of the linear actuator 17. When an output shaft of the stepping motor 15 rotates forward or reverse, the elevating table 16 and the arm portion 7 fixed to the elevating table 16 move up and down in the vertical direction. As described above, the FOUP transfer device 1 is characterized by its ability to mount the FOUP 3 in a predetermined position as well as load ports 18-1 and 18-2 shown in FIG. 5 and beyond. However, the FOUP transfer device 1 does not have a mechanism for opening and closing the door of the FOUP 3 provided in the load ports 18-1 and 18-2 and a mechanism called a mapper for detecting a mounting state of the wafer housed inside the FOUP 3, but has the FOUP transfer mechanism 5 which is not provided by the load ports 18-1 and 18-2.

The FOUP transfer device 1 of the present embodiment has a configuration that can be easily moved to a predetermined place by casters 19 attached to four corners of the bottom of the housing 2. In additions, an adjuster 20 is arranged adjacent to each caster 19 to adjust horizontal inclination of the mounting table 4. Further, the FOUP transfer device 1 is provided with a manual switch 21 that allows an operator to operate a swinging action of the arm drive mechanism 8 and a lifting action of the elevating mechanism 9 separately. Furthermore, the FOUP transfer device 1 is also provided with an area sensor 23 and an emergency stop switch 22 to stop actions of the FOUP transfer device in case of an emergency, so that the action of each drive mechanism can be stopped in an emergency.

Figure 13:
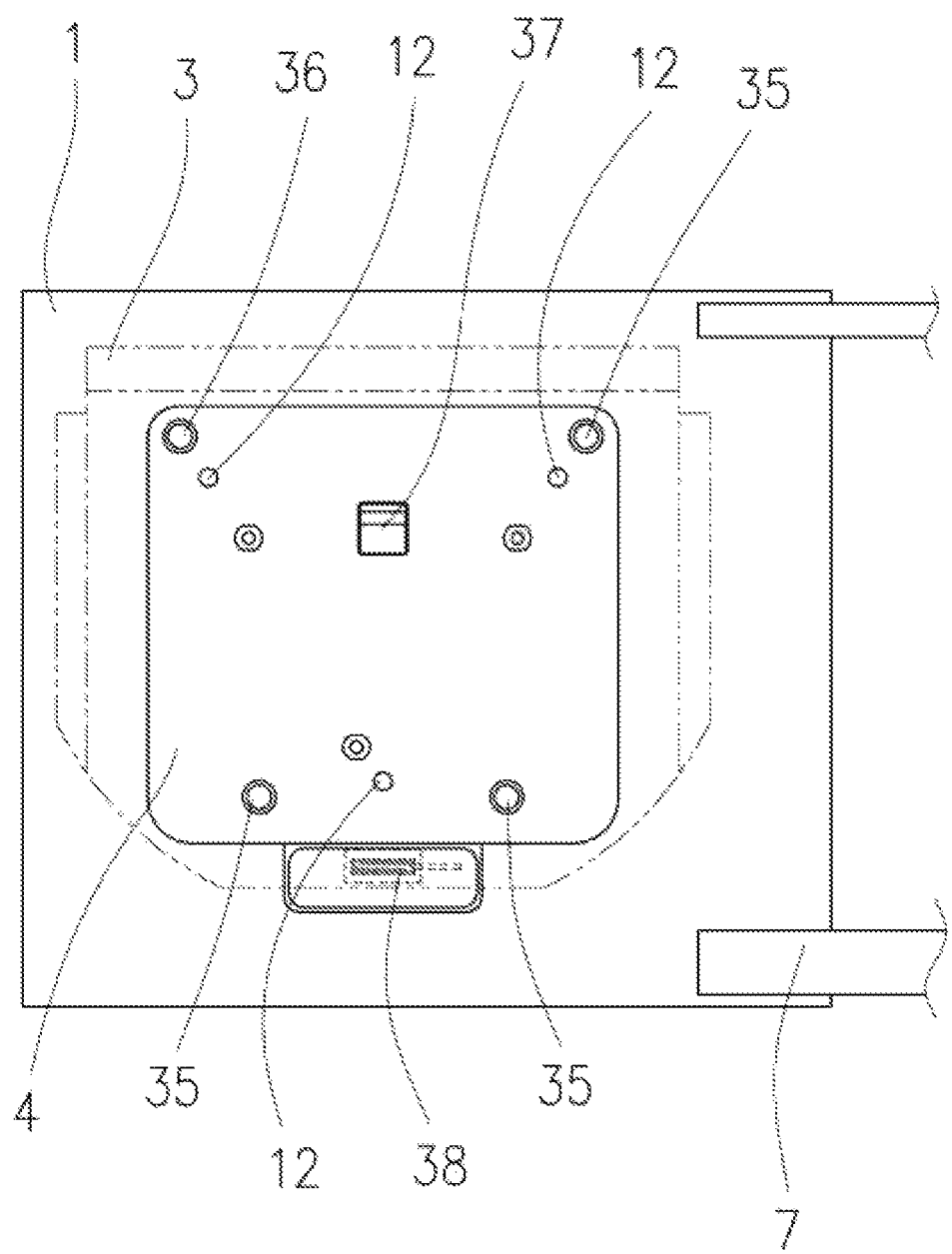
FIG. 13 is a view of the FOUP transfer device of the embodiment of the present invention as viewed from above.

Further, the FOUP transfer device 1 of the present embodiment may be configured to include an atmosphere replacement unit that replaces the internal atmosphere of the FOUP 3 with an inert gas. The atmosphere replacement unit consists of an inert gas supply means (not shown) that supplies an inert gas, an exhaust means (not shown) that exhausts the internal atmosphere of the FOUP 3, a supply nozzle 35 that supplies the inert gas supplied from the gas supply means to the internal space of the FOUP 3 through a gas supply port provided on the bottom of the FOUP 3, and an exhaust nozzle 36 that discharges the internal atmosphere of the FOUP 3 through a gas exhaust port provided on the bottom of the FOUP 3. See FIG. 13. With the above configuration, the FOUP transfer device 1 can maintain the inside of the mounting FOUP 3 in an inert gas atmosphere. Therefore, even if the FOUP 3 waits a long time for processing, it is possible to prevent a natural oxide film from being formed on the surface of a wafer W housed in the FOUP 3.

The supply nozzle 35 and the exhaust nozzle 36 are arranged on the top of the mounting table 4, which are positioned so as to face the gas supply port and the gas exhaust port of the FOUP 3 supported by the FOUP support pin 12, respectively. Further, the supply nozzle 35 and the exhaust nozzle 36 are configured to be able to advance and retreat toward the gas supply port and the gas exhaust port of the FOUP 3 by means of an advance/retreat mechanism (not shown). With the above configuration, the inside of the FOUP 3 mounted on the mounting table 4 can be replaced with an inert gas atmosphere from the atmospheric atmosphere, and deterioration of the surface of the wafer W housed in the FOUP 3 can be prevented. The FOUP 3 may also be a structure including a fixing member 37 that fixes the FOUP 3 to the mounting table 4. By including the fixing member 37, it is possible to prevent the FOUP 3 from being displaced due to the actions of the supply nozzle 35 and the exhaust nozzle 36 protruding toward the FOUP 3. Further, the mounting table 4 may be provided with a RF receiver 38 that receives a RF (Radio Frequency) tag signal provided in the FOUP 3.

Figure 4:
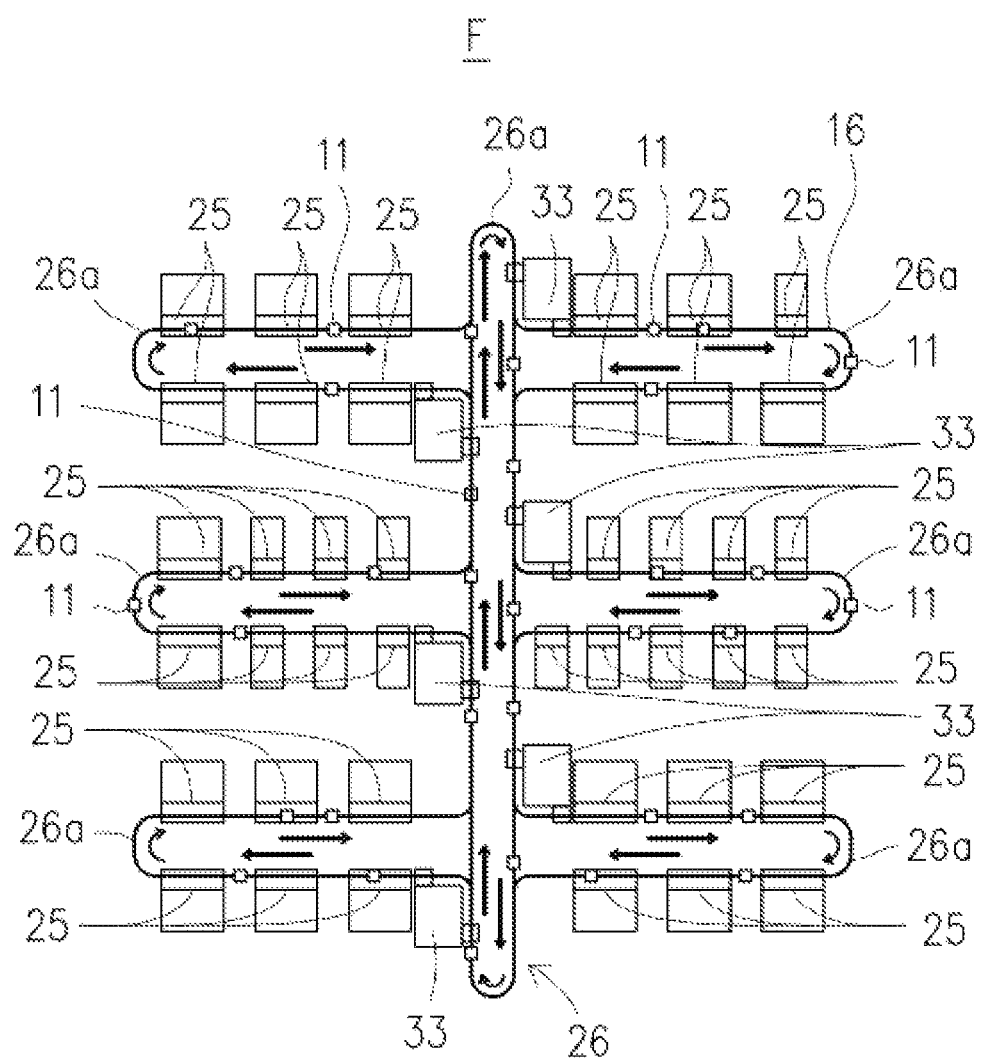
FIG. 4 is a schematic view showing a semiconductor manufacturing factory.
Figure 5:
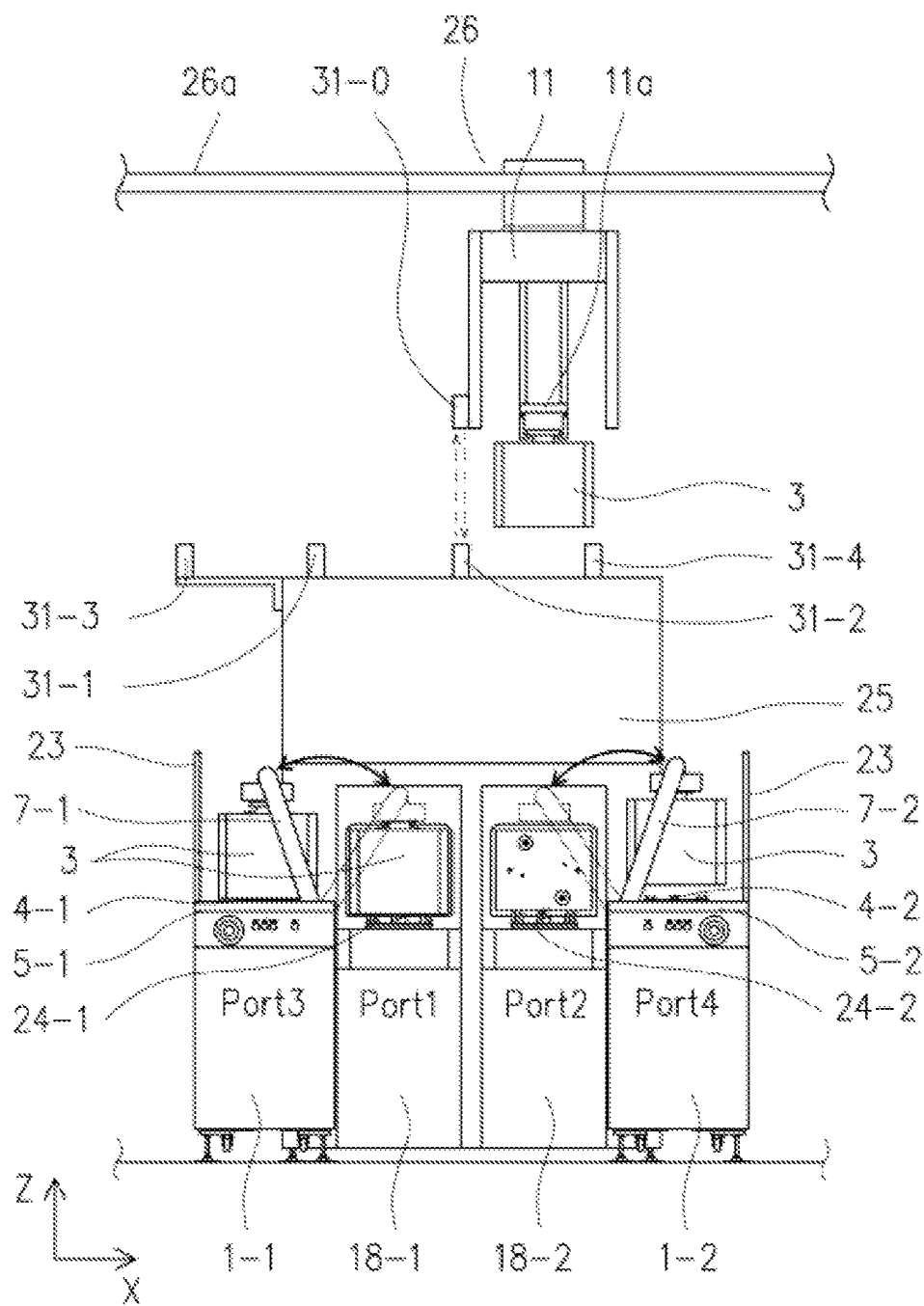
FIG. 5 is a front view showing a state in which the FOUP transfer device of the present embodiment is installed in the vicinity of an EFEM.
Figure 6:
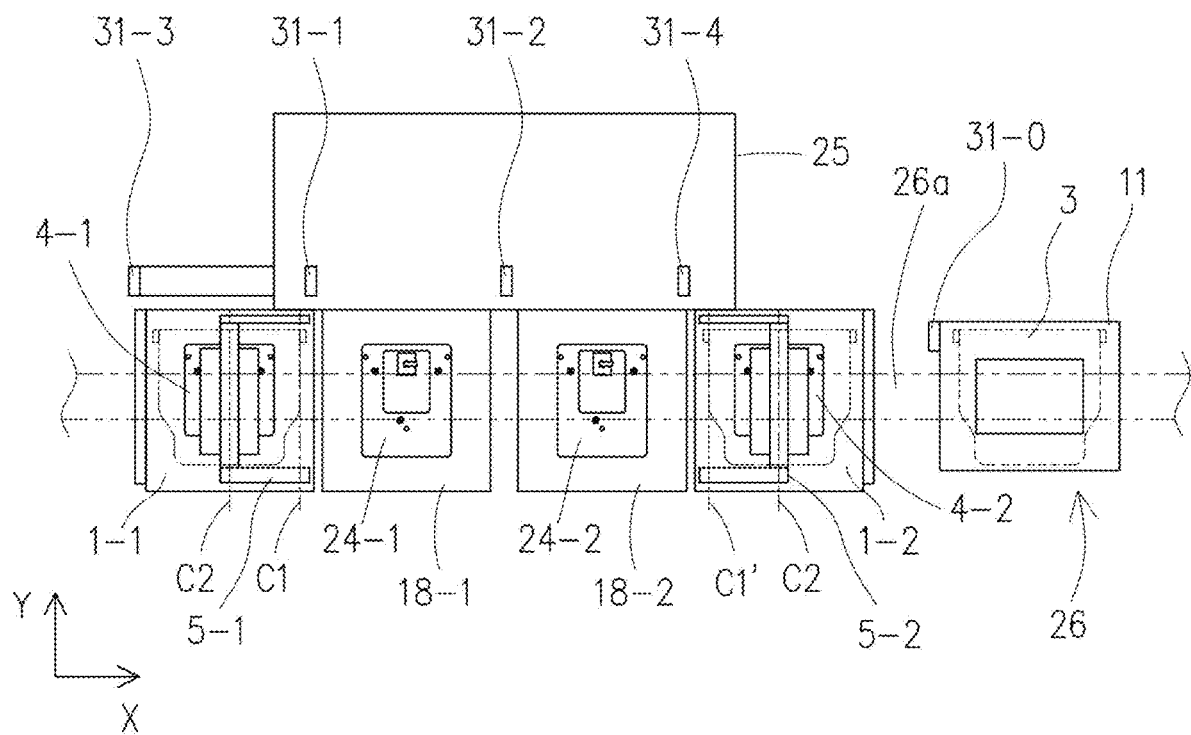
FIG. 6 is a plane view showing a state in which the FOUP transfer device of the present embodiment is installed in the vicinity of the EFEM from the upper surface.

Next, an embodiment in which the FOUP transfer device 1 is installed in the vicinity of an EFEM 25 installed in the semiconductor manufacturing factory F will be described. FIG. 4 is a schematic view showing an arrangement of each device in the semiconductor manufacturing factory F. Further, FIG. 5 is a front view showing the EFEM 25 and FOUP transfer devices 1-1 and 1-2 of the present embodiment installed in the vicinity of the EFEM 25, and FIG. 6 is a top view thereof. A large number of dedicated processing devices that performs various surface treatments and inspections on the wafer are arranged in the semiconductor manufacturing plant F, and the wafer is transported to the EFEM 25 included in each processing device by the OHT cart 11 of the OHT 26 with being housed in the FOUP 3 between the processing devices. Further, stockers 33 for temporarily housing the FOUP 3 are arranged in various places in the semiconductor manufacturing factory F, and the FOUP 3 housed in each stocker 33 is timely transported to the EFEM 25. As shown in FIG. 6, in the OHT 26, a plurality of OHT carts 11 move on a track 26a laid so as to pass directly above each EFEM 25 installed in the semiconductor manufacturing factory F to transport the FOUP 3. Besides, in many semiconductor manufacturing factories F, there is laid only one line of track 26a of OHT 26, and the OHT cart 11 can move in only one direction on this track.

As shown in FIG. 5, the OHT cart 11 moved directly above stages 24-1 and 24-2 provided by the predetermined load ports 18-1 and 18-2 lowers a hoist mechanism 11a in the vertical direction to hold the top flange 3a of the FOUP 3, and thereafter, raises the hoist mechanism 11a to house the FOUP 3 in an unmanned OHT cart 11, thereby retrieving the FOUP 3. Further, the hoist mechanism 11a holding the FOUP 3 is lowered in the vertical direction to mount the FOUP 3 on the stages 24-1 and 24-2. After releasing the holding of the top flange 3a, the hoist mechanism 11a is raised, thereby supplying the FOUP 3. The OHT cart 11 stores in advance position information of devices such as the EFEM 25 and the load ports 18-1 and 18-2 arranged in the semiconductor manufacturing factory F, and receives a command from a host computer 28 described later to automatically travel to the specified position. Further, identification marks such as barcodes are installed at positions directly above the load ports 18-1 and 18-2 on the track 26*a*, and the OHT cart 11 detects these identification marks to recognize the target position.

Further, the OHT cart 11 is provided with an optical I/O communication device 31-0, and configured to be capable of sending and receiving signals to and from the optical I/O communication devices 31-1 and 31-2 when the OHT cart 11 reaches above the load ports 18-1 and 18-2. Here, the optical I/O communication devices 31-0 to 31-2 and the optical I/O communication devices 31-3 to 31-6 used in the respective embodiments described below convert electrical signals emitted by control means provided in the device into optical signals such as infrared rays to send and receive them. It is preferable to using one conforming to SEMI E84 of a standard developed by SEMI (Semiconductor Equipment and Materials International) that is international industry associations for semiconductor manufacturing equipment and materials. In the EFEM 25 of the present embodiment, send/receive portions of the optical I/O communication devices 31-1 and 31-2 connected to the load port 18-1, 18-2 are disposed on the ceiling portion of the EFEM 25, which are disposed on locations where optical I/O communication is possible with the send/receive portions of the optical I/O communication device 31-0 provided by the OHT cart 11 when the OHT cart 11 moves to places where the FOUP 3 can be transferred to the load ports 18-1 and 18-2. Besides, the optical I/O communication devices 31-1 and 31-2 connected to the load port 18-1, 18-2 may be fixed to a place other than the ceiling portion of the EFEM 25, for example, they may be fixed on the track 26*a*.

The EFEM 25 of the present embodiment includes two load ports 18-1 and 18-2. The load ports 18-1 and 18-2 provided by the EFEM 25 are given an identification number of Port 1 on the left load port 18-1 with a front view, and the identification number of Port 2 on the right load port 18-2 therewith. Further, since the two FOUP transfer devices 1-1 and 1-2 are additionally installed in the vicinity of the load ports 18-1 and 18-2, the two-port EFEM 25 substantially has FOUP 3 mounting function for four ports. The first FOUP transfer device 1-1 of the present embodiment is on the left side of the load port 18-1 (Port 1) with a front view and is placed adjacent to the load port 18-1 (Port 1), and the second FOUP transfer device 1-2 is on the right side of the load port 18-2 (Port 2) with a front view and is placed adjacent to the load port 18-2 (Port 2). Besides, the first FOUP transfer device 1-1 is given an identification number of Port 3, and the second FOUP transfer device 1-2 is given an identification number of Port 4. Further, each load port 18-1, 18-2 provided by the EFEM 25 is arranged in the track 26*a* extending in the X direction. The first FOUP transfer device 1-1 and the second FOUP transfer device 1-2 that are installed in the vicinity of the load ports 18-1 and 18-2 are also located directly below the track 26*a* extending in the X direction, as well as these load ports 18-1 and 18-2, so as to transfer the FOUP 3 to and from the OHT cart 11. In other words, the load ports 18-1 and 18-2, and the FOUP transfer devices 1-1 and 1-2 are arranged in line in the X direction so as to coincide with the track 26*a* extending in the X direction. Furthermore, in the position where the OHT cart 11 exchanges the FOUP 3 between the FOUP transfer device 1-1 and the second FOUP transfer device 1-2 in the upward track 26*a* of the FOUP transfer device 1-1 and the second FOUP transfer device 1-2, there is a non-illustrated identification mark for the OHT cart 11 to recognize the position.

A FOUP transfer mechanism 5-1 provided by the first FOUP transfer device 1-1 of the present embodiment includes an arm portion 7-1 having a length dimension capable of transferring the FOUP 3 between the first FOUP transfer device 1-1 (Port 3) and the Port 1, and a FOUP transfer mechanism 5-2 provided by the second FOUP transfer device 1-2 includes an arm portion 7-2 having a length dimension capable of transferring the FOUP 3 between the second FOUP transfer device 1-2 (Port 4) and the Port 2. The first FOUP transfer device 1-1 and the second FOUP transfer device 1-2 have a symmetrical configuration in view of the drawing. A rotation axis C1 of the FOUP transfer mechanism 5-1 provided by the first FOUP transfer device 1-1 is placed on the right edge of the first FOUP transfer device 1-1, that is, near the load port 18-1, with a drawing view, while the rotation axis C1' of the FOUP transfer mechanism 5-2 provided by the second FOUP transfer device 1-2 is placed on the left edge of the second FOUP transfer device 1-2, that is, near the load port 18-2, with a drawing view. According to theses, the first FOUP transfer device 1-1 can move the FOUP 3 to and from the Port 1 located to the right, and the second FOUP transfer device 1-2 can move the FOUP 3 to and from the Port 2 located to the left.

Figure 7:
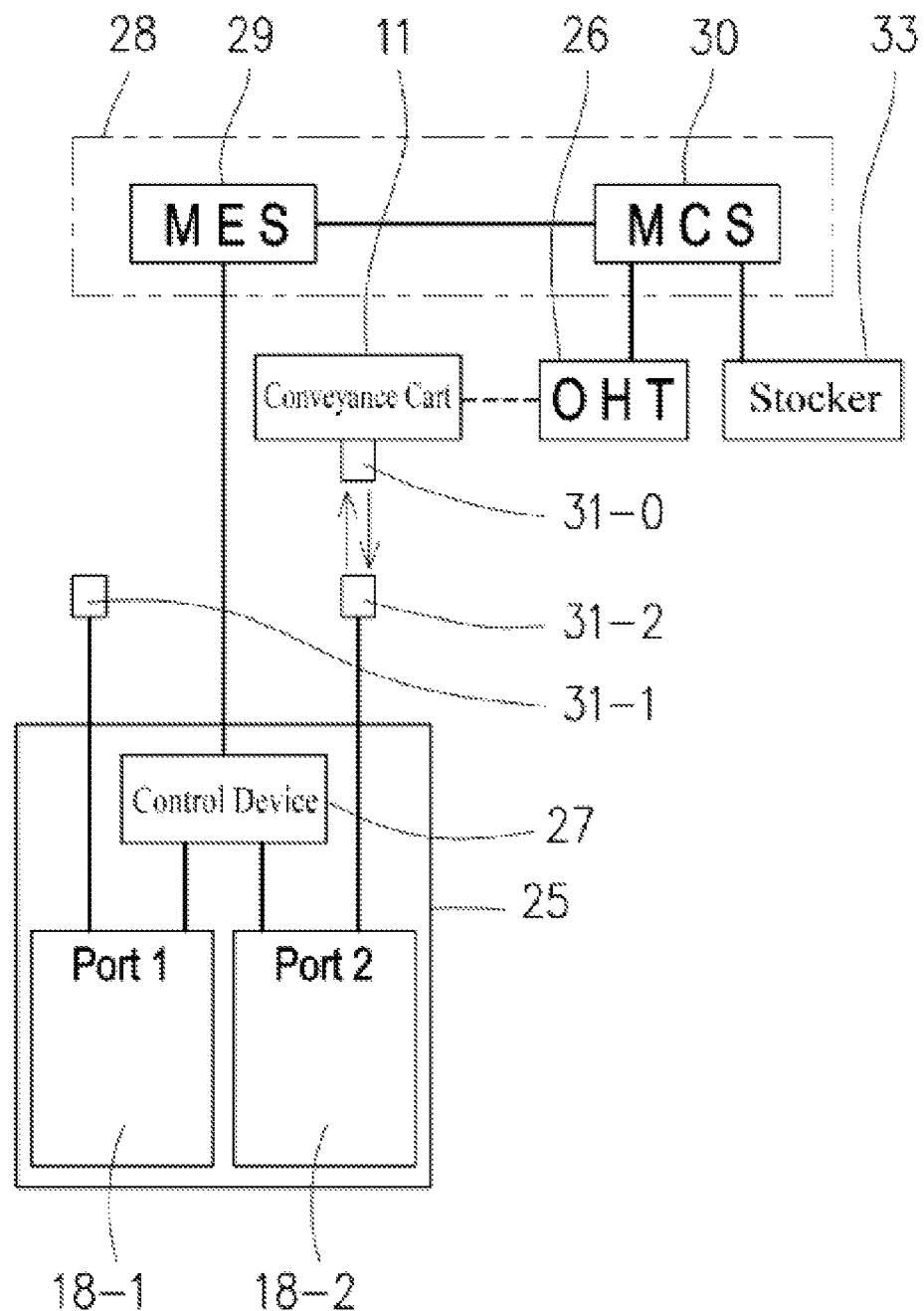
FIG. 7 is a block diagram showing a communication system included in the conventional EFEM.
Figure 8:
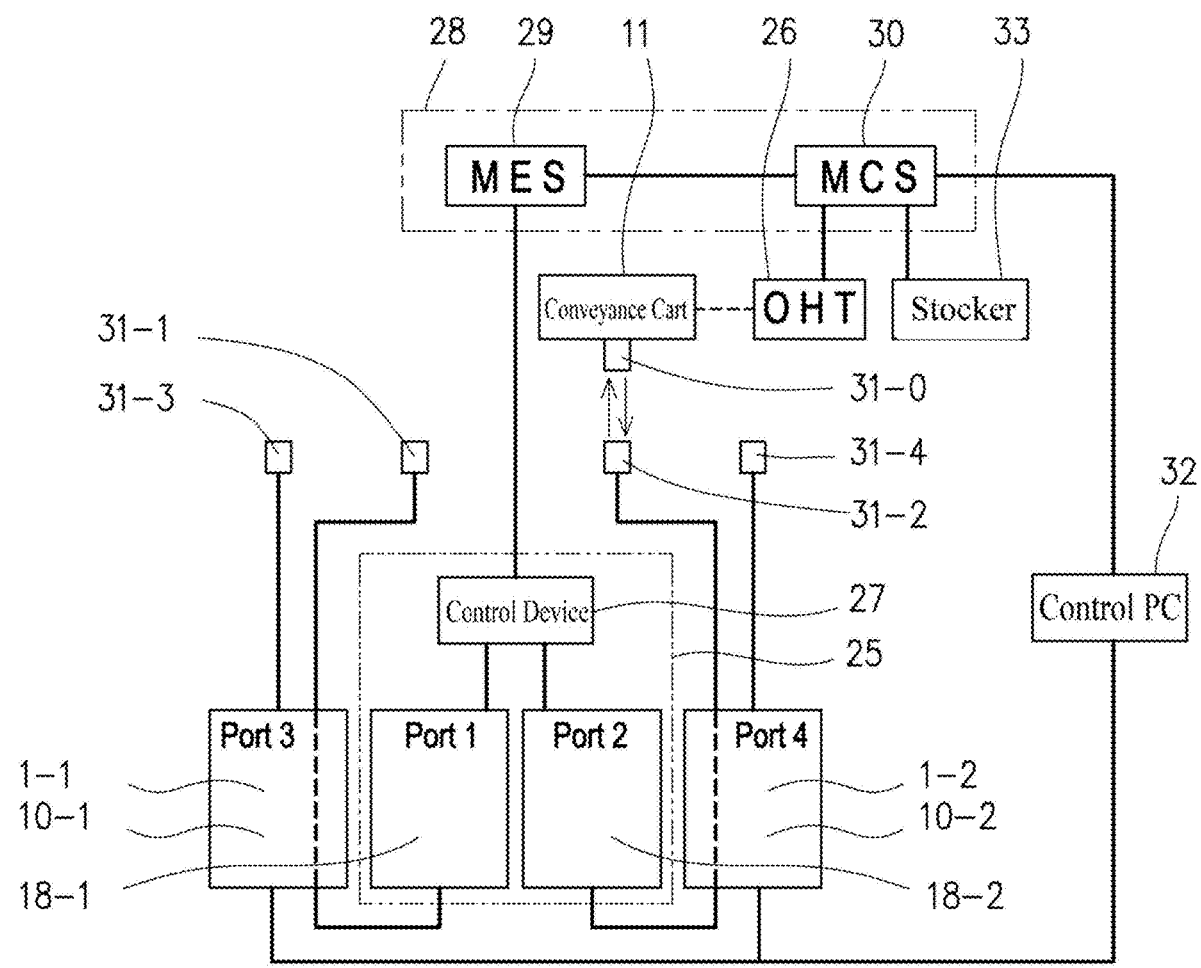
FIG. 8 is a block diagram showing a communication system after the FOUP transfer device of the present embodiment is added.
Figure 10A:
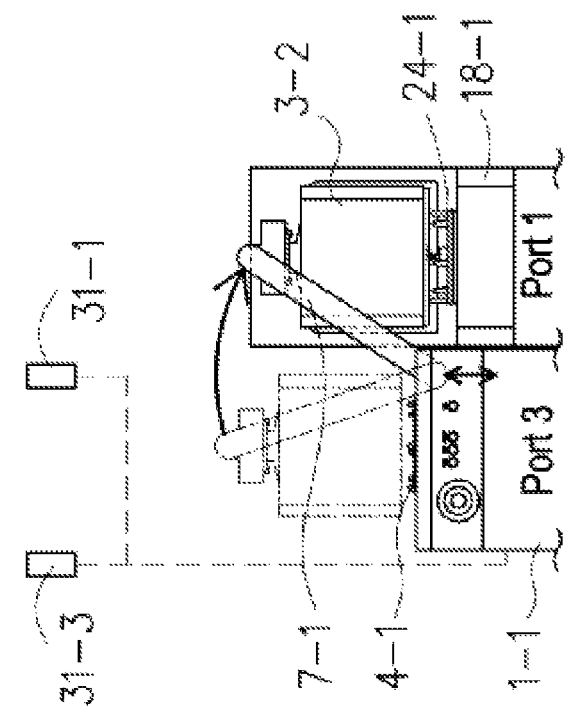
FIG. 10A and FIG. 10B show an operation of the FOUP transfer device of the present embodiment.
Figure 10B:
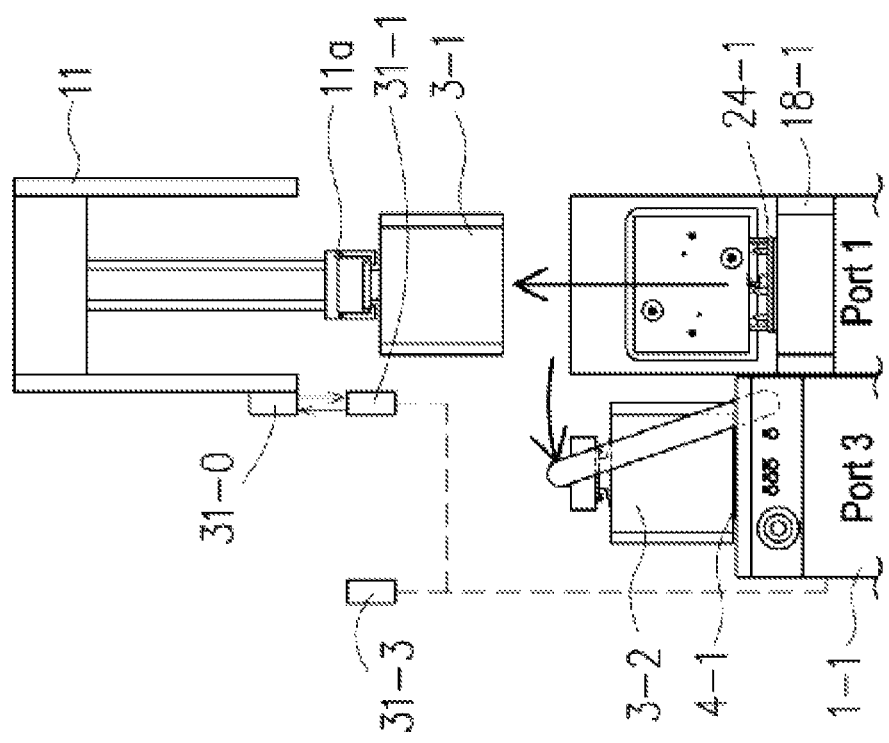

Next, communication performed by the FOUP transfer device 1 of the present embodiment with the OHT 26 will be described. FIG. 7 is a block diagram showing a communication system of EFEM 25 before the FOUP transfer devices 1-1 and 1-2 are added, and FIG. 8 is a block diagram showing a communication system of EFEM 25 after the FOUP transfer devices 1-1 and 1-2 are added and the transfer devices 1-1 and 1-2. The EFEM 25 is provided with a control unit 27. The control unit 27 communicates with the load ports 18-1 and 18-2 that open and close the door of the FOUP 3, a wafer transfer robot that conveys the wafer between the FOUP 3 and the processing device, and a wafer aligner that positions the wafer to understand the operation status of each mechanism and send motion commands to each mechanism along with pre-remembered operating programs. The control unit 27 also exchanges operating information with the processing device arranged on the back of the EFEM 25, and the control unit 27 further exchanges information about the processing process with a host computer 28 that manages the manufacturing process of the semiconductor manufacturing factory F.

The host computer 28 is a communication means that communicates with communication terminals of the processing devices installed in the semiconductor manufacturing factory F, a storage means that stores communication records performed between programs and terminals, and a computing device. The host computer 28 includes an MES (Manufacturing Execution System) 29 that manages the manufacturing process of the entire factory and an MCS (Material Control System) 30 that controls the operation of FOUP 3 transport equipment and stockers 33 in the factory, and sends a directive to the OHT 26 to supply the FOUP 3 to the EFEM 25 and/or to retrieve the FOUP 3 from the EFEM 25 from the progress of the EFEM 25. The MES 29 is an integrated production information system that plays a central role in various information management in the semiconductor manufacturing factory F, and performs production support and management such as process management, lot management, progress management and so on.

Further, the MCS 30 manages the FOUPs 3 and empty FOUPs 3 housing wafers according to the manufacturing process stored in the storage means in advance, and sends a conveyance command to the control means included in the stocker 33 and the OHT 26. The position information of the load ports 18-1 and 18-2 in the semiconductor manufacturing factory F is recorded to the MCS 30 by the operator in advance, and the MCS 30 commands the conveyance of the FOUP 3 to the OHT 26 based on this information. In addition, information on FOUP transfer devices 1-1 and 1-2 newly installed in the semiconductor manufacturing factory F is also recorded to the MCS 30 by the operator at the timing of installation.

When receiving a FOUP transport command from the MCS 30, the stocker 33 transfers a FOUP 3 with work in process or an empty FOUP 3 to the predetermined OHT cart 11 of the OHT 26. When the OHT cart 11 moves directly above the instructed load ports 18-1 and 18-2, it confirms whether the FOUP 3 can be mounted between the load ports 18-1 and 18-2, and when it receives the mountable signal from the load ports 18-1 and 18-2, it mounts the FOUP 3. Further, the OHT cart 11 moves directly above the predetermined load ports 18-1 and 18-2 in an empty state without holding the FOUP 3, and communicates with the load ports 18-1 and 18-2, and thereafter, receives FOUP 3 mounted on stages 24-1 and 24-2 of the load ports 18-1 and 18-2 and conveys it to the stocker 33. Besides, an optical I/O communication device 31-0 included in the FOUP transfer devices 1-1 and 1-2, the load port 18, and the OHT cart 11 of the present embodiment is a communication device that conforms to a SEMI standard that is established by SEMI (Semiconductor Equipment and Materials International), which is an international industry group related to semiconductor manufacturing equipment, and uses infrared rays to send and receive necessary data between each other.

Next, a communication mode between the FOUP transfer devices 1-1 and 1-2 of the present embodiment and the load port 18 will be described. The FOUP transfer devices 1-1 and 1-2 of the present embodiment are installed in the vicinity of the load ports 18-1 and 18-2 included in the EFEM 25 already installed in the semiconductor manufacturing factory F. As described above, the load ports 18-1 and 18-2 of the EFEM 25 are provided with the optical I/O communication devices 31-1 and 31-2, respectively, and each send/receive portion is fixed to the ceiling of the EFEM 25 so that the OHT cart 11 of the OHT 26 is placed directly above each FOUP transfer device 1-1 and 1-2. According to this, each of the already installed load ports 18-1 and 18-2 and the newly added FOUP transfer devices 1-1 and 1-2 is configured to be provided with the optical I/O communication devices 31-1 to 31-4 that individually communicate with the OHT cart 11. However, when the load ports 18-1 and 18-2 and the FOUP transfer devices 1-1 and 1-2 are formed to communicate with the OHT cart 11 individually, it is necessary to temporarily turn off the power of the EFEM 25 itself in order to change the program of the control device 27 included in the EFEM 25 or the communication settings, and it takes a lot of time to modify each device due to the additional installation of the FOUP transfer devices 1-1 and 1-2.

Therefore, the FOUP transfer devices 1-1 and 1-2 of the present embodiment not only perform optical I/O communication with the OHT cart 11, but also can perform optical I/O communication between the adjacent load ports 18-1 and 18-2 and the OHT cart 11 on behalf of the load ports 18-1 and 18-2. Specifically, the FOUP transfer device 1-1 (Port 3) installed to the left of the load port 18-1 of the first port not only performs optical I/O communication with the OHT cart 11 as the third port, but also performs optical I/O communication with the OHT cart 11 as the first port on behalf of the load port 18-1. Further, the FOUP transfer device 1-2 (Port 4) installed to the right of the load port 18-2 of the second port not only performs optical I/O communicates with the OHT cart 11 as the fourth port, but also performs optical I/O communication with the OHT cart 11 as the second port on behalf of the load port 18-2 (Port 2).

Further, the FOUP transfer devices 1-1 and 1-2 are provided with a control PC 32 that communicates with the MCS 30 included in the semiconductor manufacturing factory F, and the control PC 32 exchanges operation information of the two FOUP transfer devices 1-1 and 1-2 and load ports 18-1 and 18-2 and operation information of the OHT 26 with the MCS 30. Besides, the communication between the control PC 32 and the MCS 30 is performed on Ethernet (registered trademark). With the above configuration, the FOUP transfer devices 1-1 and 1-2 can be incorporated into network system of the semiconductor manufacturing factory F without making major changes to the control means provided in the EFEM 25 and the load ports 18-1 and 18-2. Since the control PC 32 is a relatively small box, it may be stored in the internal space of the housing 2 of the FOUP transfer devices 1-1 and 1-2, or it may be stored in the internal space of the EFEM 25.

The control units 10-1 and 10-2 included in the FOUP transfer devices 1-1 and 1-2 store at least a CPU, a communication means for communicating with other devices, and a storage means for storing the operating programs and various data. The communication means included in the control units 10-1 and 10-2 has an LP communication means for communicating with the adjacent load ports 18-1 and 18-2, an optical I/O communication means for communicating with the OHT cart 11 via the optical I/O communication devices 31-3 and 31-4, and a PC communication means for communicating with the control PC 32 controlling the FOUP transfer devices 1-1 and 1-2 in a centralized manner. Further, the optical I/O communication means included in the control units 10-1 and 10-2 is connected to the second optical I/O communication devices 31-1 and 31-2 included in the load ports 18-1 and 18-2 in addition to the first optical I/O communication device 31-3 and 31-4 included in the FOUP transfer devices 1-1 and 1-2. According to this, the control units 10-1 and 10-2 can communicate with the OHT cart 11 via the second optical I/O communication devices 31-1 and 31-2 originally included in the load ports 18-1 and 18-2 on behalf of the load ports 18-1 and 18-2, respectively in addition to communicating with OHT cart 11 via the first optical I/O communication devices 31-3 and 31-4 included in the FOUP transfer devices 1-1 and 1-2.

Further, the control units 10-1 and 10-2 sends a signal corresponding to signals received via the first optical I/O communication devices 31-3 and 31-4, and a signal appropriate for the state of the load ports 18-1 and 18-2 obtained via an unshown LP communication means for signals received via the second optical I/O communication devices 31-1 and 31-2 originally included in the load ports 18-1 and 18-2, to the OHT cart 11 via the second optical I/O communication devices 31-1 and 31-2. As described above, the LP communication means is used when the FOUP transfer devices 1.1 and 1.2 recognize the state of the load ports 18-1 and 18-2, and in addition, also used to signal the start of operation on the load ports 18-1 and 18-2 when the FOUP transfer devices 1-1 and 1-2 transfer the FOUP 3 with the load ports 18-1 and 18-2. in addition to recognizing the state of the load ports 18-1 and 18-2.

The control PC 32 communicates between the control units 10-1 and 10-2 of the FOUP transfer devices 1-1 and 1-2 and the MCS 30. The control PC 32 not only controls the two FOUP transfer devices 1-1 and 1-2 of the present embodiment, but also controls a plurality of other FOUP transfer devices 1 within the limit of the number of communication ports. Communication between the control PC 32 and the MCS 30 is performed on Ethernet (registered trademark) to send the signals sent from the MCS 30 to the FOUP transfer devices 1-1 and 1-2 and the signal sent from each of the FOUP transfer devices 1-1 and 1-2 to the MCS 30.

It should be noted here that the EFEM 25 sends status of the device to the MES 29 managing the process of the entire semiconductor manufacturing factory F and receives the control signals from the MES 29, whereas the FOUP transfer devices 1-1 and 1-2 of the present embodiment communicate with the MCS 30 via the control PC 32. The MCS 30 is connected to conveyance equipment included in the semiconductor manufacturing factory F, and has a role of supervising and controlling transfer commands for each conveyance equipment. Further, the MCS 30 moves the FOUP 3 housed in the stocker 33 to the FOUP transfer devices 1-1 and 1-2 at a stage before the required timing, and send a command to immediately transfer the FOUP 3 from the FOUP transfer devices 1-1 and 1-2 to the load ports 18-1 and 18-2 at the required timing, thereby reducing the time spent waiting for the FOUP 3 of the load ports 18-1 and 18-2.

Next, the operation of the FOUP transfer devices 1-1 and 1-2 and the OHT cart 11 will be described in detail. FIGS. 9A and 9B, FIGS. 10A and 10B, FIGS. 11A and 11B show an operation in which the EFEM 25 provided with the FOUP transfer device 1-1 shown in FIG. 5 transfers the FOUP 3 between the FOUP transfer device 1-1 and the load port 18. The first FOUP 3-1 housing a wafer that is to be processed by the processing device is mounted on the load port 18-1 (Port 1). This first FOUP 3-1 was waiting on the mounting table 4-1 of the FOUP transfer device 1-1 until just before, and was transferred to stage 24-1 of the load port 18-1 by the arm portion 7-1 of the FOUP transfer device 1-1. The first FOUP 3-1 has the door opened by the load port 18-1, and the unprocessed wafers in the first FOUP 3-1 are sequentially transferred to the processing device. Then, the wafer that has been subjected to the predetermined processing by the processing device is transferred to the FOUP 3 mounted on the load port 18-2. Here, the FOUP 3 is to house the processed wafer.

At this time, the host computer 28 sends a signal to the FOUP transfer device 1-1 via the control PC 32 that requires the FOUP transfer device 1-1 to notify the state of the device. The FOUP transfer device 1-1 receives the signal from the host computer 28, and then, sends a signal to the host computer 28 via the control PC 32 that a new FOUP 3 can be mounted on the mounting table 4-1. Here, the arm portion 7-1 of the FOUP transfer device 1-1 stands ready at a position that does not interfere with raising/lowering of a hoist mechanism 11a included in the OHT cart 11 and the operation of the load port 18-1.

After receiving the signal from the FOUP transfer device 1-1, the host computer 28 operates the stocker 33 and the OHT cart 11 of the OHT 26 to move the second FOUP 3-2 containing unprocessed wafers to predetermined positions directly above the FOUP transfer device 1-1 (Port 3). See FIG. 9A. The OHT cart 11 that has transported the second FOUP 3-2 to the predetermined position sends a signal that requires the second FOUP 3-2 to be mounted to the first optical I/O communication device 31-3 provided by the FOUP transfer device 1-1 via the optical I/O communication device 31-0 before lowering the second FOUP 3-2. The FOUP transfer device 1-1 receives the signal and sends an allow (ACK) signal if the FOUP can be mounted, and sends a disallow (NACK) signal to the OHT cart 11 via the first optical I/O communication device 31-3 if the FOUP cannot be mounted. When the OHT cart 11 receives the allow (ACK) signal from the FOUP transfer device 1-1, it activates the hoist mechanism 11a to mount the second FOUP 3-2 on the mounting table 4-1 of the FOUP transfer device 1-1. See FIG. 9B. The second FOUP 3-2 contains wafers that have not yet been processed by the processing devices like the first FOUP 3-1, and stands ready on the mounting table 4-1 until the first FOUP 3-1 is conveyed out from the stage 24-1 of the load port 18-1.

Then, when all the wafers housed in the first FOUP 3-1 are conveyed to the processing device, the host computer 28 moves the OHT cart 11 to the predetermined position directly above the load port 18-1 in order to recover empty first FOUP 3-1 on the load port 18-1 (Port 1). Then, the OHT cart 11 sends a signal requesting recovery of the first FOUP 3-1 to the load port 18-1 via the optical I/O communication device 31-0. Here, the second optical I/O communication device 31-1 included in the load port 18-1 has been changed to connect to the control unit 10 in the FOUP transfer device 1-1 when the FOUP transfer device 1-1 is installed. Therefore, the signal sent from the optical I/O communication device 31-0 of the OHT cart 11 moving directly above the load port 18-1 (Port 1) to the second optical I/O communication device 31-1 of the load port 18-1 is received by the FOUP transfer device 1-1 (Port 3) in place of the load port 18-1 (Port 1). See FIG. 10A.

After receiving the signal from the OHT cart 11, the FOUP transfer device 1-1 (Port 3) communicates with the load port 18-1 (Port 1), and then sends an allow (ACK) signal or a disallow (NACK) signal to the OHT cart 11 via the optical I/O communication device 31-1.

The load ports 18-1 and 18-2 have load detection sensors that detect whether or not the FOUP 3-1 and 3-2 are mounted on the stages 24-1 and 24-2, and whether or not they are normally mounted thereon. The load port 18-1 recognizes that nothing is mounted on the stage 24-1 from the detection result of the load detection sensor, and sends a signal that there is no load on the stage 24-1 to the FOUP transfer device 1-1. After receiving the signal from the load port 18-1, the FOUP transfer device 1-1 operates the arm portion 7-1 to transfer the second FOUP 3-2 mounted on the mounting table 4-1 to the stage 24-1 of the adjacent load port 18-1. See FIG. 10B. Each FOUP transfer device 1-1 sends a signal similar to the signal sent to the OHT cart 11 to the host computer 28 via the control PC 32, if necessary. After receiving the recovery allow signal, the OHT cart 11 activates the hoist mechanism 11a and the FOUP holding mechanism to recover the first FOUP 3-1 mounted on the load port 18-1. Then, the OHT cart 11 transports the first FOUP 3-1 to a destination designated by the host computer 28.

The load port 18-1 (Port 1) on which the second FOUP 3-2 is mounted by the FOUP transfer device 1-1 fixes the second FOUP 3-2 to the stage 24-1 by the fixing means, and thereafter, opens the door of FOUP 3-2. Then, the unprocessed wafers in the second FOUP 3-2 are sequentially transferred to the processing device, and the wafers subjected to the predetermined processing by the processing device are transferred to the FOUP 3 for housing the processed wafers mounted on the load port 18-2. When the operation of opening the door of the second FOUP 3-2 is completed, the load port 18-1 sends a wafer transfer enable signal to the control device 27 of the EFEM 25. Further, the EFEM 25 receiving the wafer transfer enable signal from the load port 18-1 operates the transfer robot to restart the wafer processing by sending a command to take out the wafer from the second FOUP 3-2 of the load port 18-1 and transfer the wafer to the processing device. Further, a command that the processed wafer is transferred from the processing device to the FOUP 3 set in the load port 18-2 is sent. Since the control device 27 included in the EFEM 25 and the load port 18-1 are originally electrically connected, it is not necessary to add wiring or the like when installing the FOUP transfer devices 1-1 and 1-2.

Next, the FOUP transfer device 1-1, which has transferred the second FOUP 3-2 to the adjacent load port 18-1, sends a transfer completion signal to the control PC 32. After receiving the signal, the control PC 32 sends a signal to the host computer 28 that the FOUP transfer device 1-1 can mount the next FOUP 3. After receiving the mountable signal, the host computer 28 sends a FOUP transport signal for the FOUP transfer device 1-1 to the stocker 33 and OHT 26 shown in FIG. 4. After receiving the transport signal from the host computer 28, the stocker 33 and the OHT 26 take out the third FOUP 3-3 containing the unprocessed wafers from the shelf of the stocker 33, and move it at the predetermined position directly above the FOUP transfer device 1-1 via the OHT cart 11. The arm portion 7-1 of the FOUP transfer device 1-1 stands ready at a position that does not interfere with raising/lowering of the hoist mechanism 11a included in the OHT cart 11 and the operation of the load port 18-1. See FIG. 11A.

The OHT cart 11 that has transported the third FOUP 3-3 to the predetermined position sends a signal to the first optical I/O communication device 31-3 included in the FOUP transfer device 1-1 via the optical I/O communication device 31-0 that requests mounting the third FOUP 3-3 before lowering the third FOUP 3-3. After receiving this signal, the FOUP transfer device 1-1 sends an allow (ACK) signal if the FOUP can be mounted, and sends a disallow (NACK) signal to the OHT cart 11 via the first optical I/O communication device 31-3 if the FOUP cannot be mounted. When the OHT cart 11 receives the allow (ACK) signal from the FOUP transfer device 1-1, it activates the hoist mechanism 11a to mount the third FOUP 3-3 on the mounting table 4-1 of the FOUP transfer device 1-1. See FIG. 11B. The third FOUP 3-3 contains wafers that have not yet been processed by the processing devices like the second FOUP 3-2, and stands ready on the mounting table 4-1 until the second FOUP 3-2 is conveyed out from the stage 24-1 of the load port 18-1.

This completes the series of FOUP transfer operations performed by the FOUP transfer device 1-1. The FOUP transfer device 1-2 (Port 4) installed in the vicinity of the load port 18-2 (Port 2) basically operates in the same manner as the FOUP transfer device 1-1. The FOUP transfer device 1-2 (Port 4) performs optical I/O communication with the OHT cart 11 via the first optical I/O communication device 31-4 and the second I/O communication device 31-2 to supply and recover the FOUP 3 to and from the load port 18-2 (Port 2).

By using the FOUP transfer device 1-1 of this embodiment as described above, the FOUP transfer device 1-1 (Port 3) can immediately supply the second FOUP 3-2 to the load port 18-1 (Port 1) after the first FOUP 3-1 mounted on the load port 18-1 (Port 1) is recovered by the OHT cart 11. According to this, the EFEM 25 can shorten the time for stopping a wafer-supply operation as much as possible. Further, by using the FOUP transfer devices 1-1 and 1-2 of the present embodiment, it is possible to perform efficient FOUP 3 reloading operations with only simple modifications on the existing transfer device.

Next, another embodiment of the present invention will be described. The FOUP transfer devices 1-1 and 1-2 according to the first embodiment of the present invention are arranged in a row of load ports 18-1 and 18-2, which are directly below one OHT track 26a and arranged in a row in the X direction. However, FOUP transfer devices 34-1 and 34-2 of the second embodiment are shifted in the Y direction relative to the row in which the load ports 18-1 and 8-2 are disposed and are parallel to the X direction. In the semiconductor manufacturing factory F, in addition to the track 26a of the OHT 26, a second track 26b extending parallel to the track 26a may be provided in order to quickly transport the FOUP 3. The FOUP transfer devices 34-1 and 34-2 are located directly below such the second track 26b.

Figure 12:
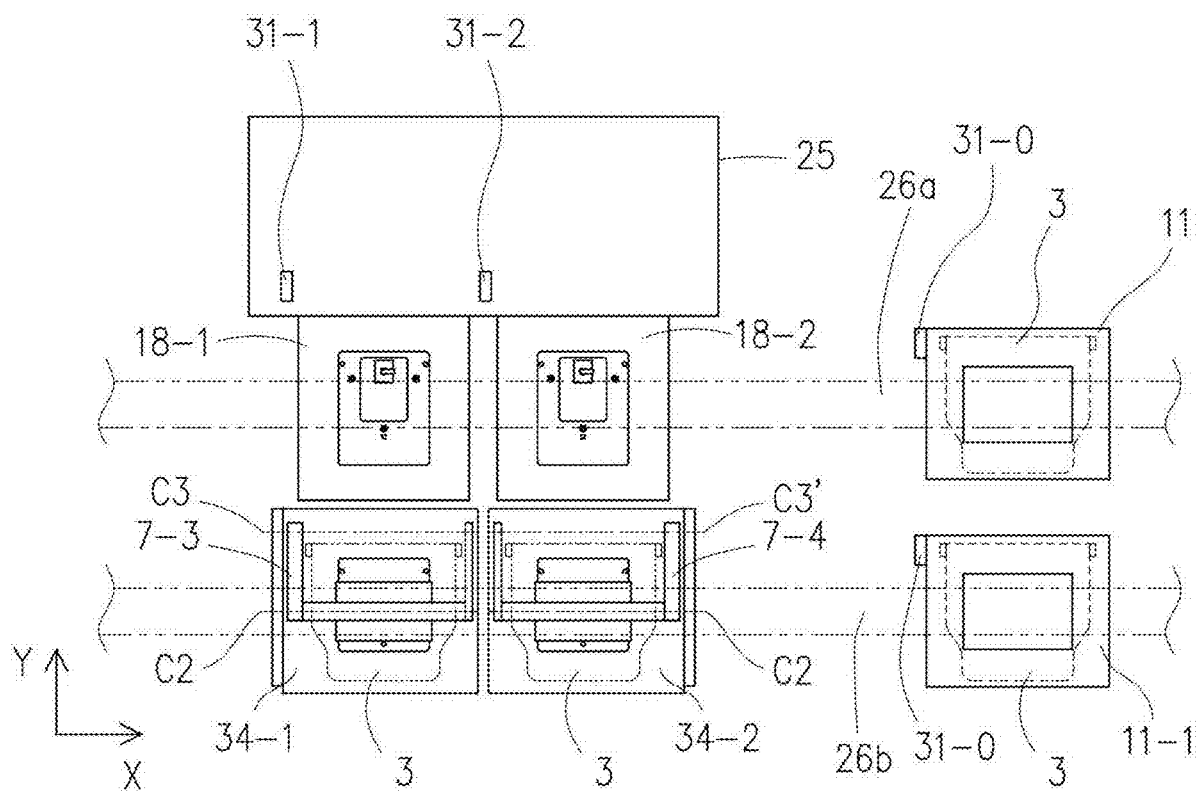
FIG. 12 shows the FOUP transfer device of an embodiment of the present invention.

FIG. 12 is a diagram showing positional relationship between the FOUP transfer devices 34-1 and 34-2 and the load ports 18-1 and 18-2 of the present embodiment. In the semiconductor manufacturing factory F in which the FOUP transfer devices 34-1 and 34-2 of the present embodiment are installed, in addition to the first track 26a, a second track 26b is installed so as to separate from the first track 26a in the Y direction, and so as to extend parallel to the first track 26a. The FOUP transfer device 34-1 of the present embodiment is located separately from the load port 18-1 in the Y direction, and directly below the second track 26b. Further, the FOUP transfer device 34-2 of the present embodiment is located separately from the load port 18-2 in the Y direction, and directly below the second track 26b. Further, the arm portion 7-3 included in the FOUP transfer device 34-1 has a length capable of transferring the FOUP 3 to and from the load port 18-1, and the arm portion 7-4 included in the FOUP transfer device 34-2 has a length capable of transferring the FOUP 3 to and from the load port 18-2. Further, the rotation axis C3 of the arm portion 7-3 and the rotation axis C3' of the arm portion 7-4 are arranged at the front edges of the FOUP transfer devices 34-1 and 34-2 looking at the drawing, that is, the rotation axes C3 and C3' are located closer to the load ports 18-1 and 18-2. According to this, the FOUP transfer device 34-1 can move the FOUP 3 to and from the forward load port 18-1 (Port 1), and the FOUP transfer device 34-2 can move the FOUP 3 to and from the forward load port 18-2 (Port 2).

Further, although the first optical I/O communication device included in the FOUP transfer devices 34-1 and 34-2 of the present embodiment is not illustrated, it is attached to the second track 26b and configured to be able to communicate with the FOUP transfer devices 34-1 and 34-2 when the OHT cart 11-1 moving on the second track 26b moves directly above the FOUP transfer devices 34-1 and 34-2. In addition, each connection of other electrical components has the same configuration as that of the first embodiment, namely, communication with the second optical I/O communication device 31-1 included in the load port 18-1 and the optical I/O communication device 31-0 included in the OHT cart 11 is performed by the FOUP transfer device 34-1, and communication with the second optical I/O communication device 31-2 included in the load port 18-2 and the optical I/O communication device 31-0 included in the OHT cart 11 is performed by the FOUP transfer device 34-2. With the above configuration, the FOUP transfer devices 34-1 and 34-2 can send and receive the FOUP 3 to and from the load ports 18-1 and 18-2 in the same manner as the FOUP transfer devices 1-1 and 1-2 of the first embodiment.

Figure 15:
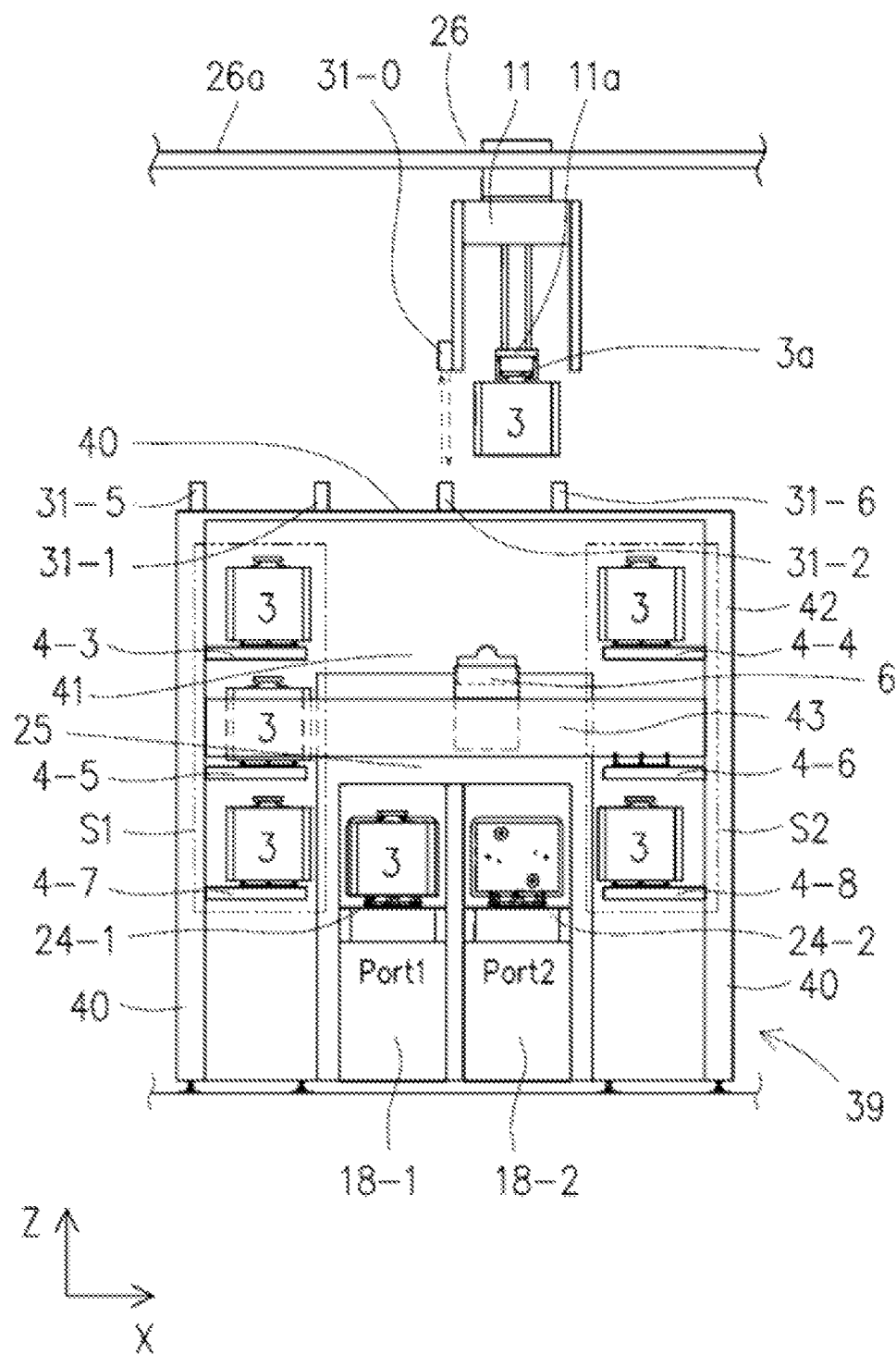
FIG. 15 is a front view showing the FOUP transfer device of the embodiment of the present invention.
Figure 16:
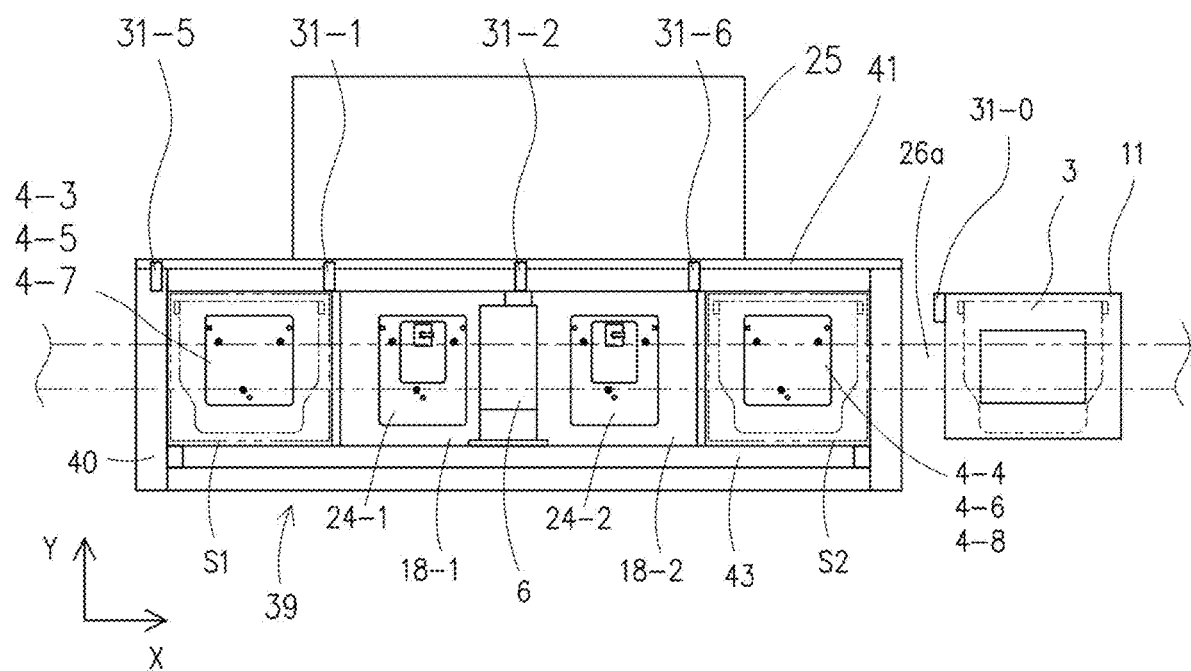
FIG. 16 is a plane view showing a state in which the FOUP transfer device of the present embodiment is installed in the vicinity of the EFEM from the top.

In the first and second embodiments of the present invention described above, the FOUP transfer devices 1-1, 1-2, 34-1 and 34-2 including one mounting table 4 on which the FOUP 3 is mounted have been described. However, the present invention is not limited to this, and it is possible to provide a plurality of mounting tables 4 on which the FOUP 3 is mounted. FIG. 14 is a perspective view showing a FOUP transfer device 39 according to a third embodiment of the present invention, and FIG. 15 is a front view thereof. Further, FIG. 16 is a view of the FOUP transfer device 39 as viewed from the top. The FOUP transfer device 39 of the present embodiment is provided with a frame 40 assembled in a rectangular parallelepiped shape, a vertical plate 41 fixed to the frame 40, a plurality of mounting tables 4-3 to 4-8 fixed to the vertical plate 41 at intervals in the vertical direction (Z direction), and a FOUP transfer mechanism 42 that transfers a FOUP 3 between each mounting table 4-3 to 4-8 and each load port 18-1 and 18-2.

The FOUP transfer device 39 is installed in front of the EFEM 25, and six mounting tables 4-3 to 4-8 on which the FOUP 3 is mounted are arranged on the vertical plate 41. The mounting tables 4-3 to 4-8 are provided three stages on both left and right sides of the EFEM 25 in the vertical direction at intervals larger than the height of the FOUP 3. Further, the mounting tables 4-3 to 4-8 stacked in the three stages on both sides constitute one storage unit S1 or S2, respectively. It is desirable that the mounting tables 4-7 and 4-8 located at the bottom stages of the storage units S1 and S2 are placed at almost the same height as the stages 24-1 and 24-2 provided by the load ports 18-1 and 18-2, or slightly higher than the stages 24-1 and 24-2, respectively.

The FOUP transfer mechanism 42 included in the FOUP transfer device 39 includes a holding portion 6 that holds the top flange 3a of the FOUP 3, a horizontal drive mechanism 43 that supports the holding portion 6 and moves the holding portion 6 in the horizontal direction (X direction), and a pair of left and right vertical drive mechanisms 44 that support the horizontal drive mechanism 43 and move the horizontal drive mechanism 43 in the vertical direction (Z direction). The horizontal drive mechanism 43 and the vertical drive mechanism 44 each include a motor as a driving source, and the holding portion 6 is moved to a predetermined position by rotating the motor in the forward direction or in the reverse direction. The motions of each motor and holding unit 6 provided by the horizontal drive mechanism 43 and the vertical drive mechanism 44 are controlled by the control unit 10-3 included in the FOUP transfer mechanism 42.

The storage units S1 and S2 included in the FOUP transfer mechanism 42 are located adjacent to the stages 24-1 and 24-2, respectively, with viewed from the top, and directly below the track 26a of the OHT 26 which is laid directly above the stages 24-1 and 24-2. See FIG. 16. Locating directly below the track 26a of the OHT 26 is capable of transferring the FOUP 3 between the OHT cart 11 and the mounting bases 4-3 and 4-4 on the uppermost stage among the left and right storage units S1 and S2. Further, since the storage units S1 and S2 do not project into a space directly above the load ports 18-1 and 18-2, the operation of transferring the FOUP 3 between the OHT cart 11 and the load ports 18-1 and 18-2 is not interfered.

By installing the FOUP transfer device 39 of the present embodiment above the load ports 18-1 and 18-2, the optical I/O communication devices 31-1 and 31-2 connected to the load ports 18-1 and 18-2 are fixed in predetermined positions of the frame 40 of the FOUP transfer device 39, respectively. When the OHT cart 11 sends and receives the FOUP 3 to and from the stage 24-1, communication is performed via the optical I/O communication device 31-1, and when the OHT cart 11 sends and receives the FOUP 3 to and from the stage 24-2, communication is performed via the optical I/O communication device 31-2. Further, the optical I/O communication device 31-5 used when the OHT cart 11 sends and receives the FOUP 3 to and from the mounting table 4-3, and the optical I/O communication device 31-6 used when the OHT cart 11 sends and receives the FOUP 3 to and from the mounting table 4-4, are fixed in a predetermined position on the frame 40 of the FOUP transfer device 39. Further, these optical I/O communication devices 31-1, 31-2, 31-5 and 31-6 are connected to the control unit 10-3 included in the FOUP transfer device 39 of the present embodiment. When sending and receiving the FOUP 3 to and from, the control unit 10-3 performs optical I/O communication with the OHT cart 11.

In each of the storage units S1 and S2, three mounting tables 4-3 to 4-8 are arranged at intervals in the vertical direction, and the OHT cart 11 sends and receives the FOUP 3 to and from the mounting tables 4-3 and 4-4 placed on the uppermost stages of the storage units S1 and S2. The FOUP 3 mounted on the top mounting tables 4-3 and 4-4 is transferred to the predetermined stages 24-1 and 24-2 by the FOUP transfer mechanism 42 included in the FOUP transfer device 39, or transported to other mounting tables 4-5 to 4-8 of the storage units S1 and S2. When all processing of the wafer W is completed, the FOUP 3 containing the processed wafer W is transferred from the stages 24-1 and 24-2 to the mounting tables 4-3 to 4-8 of the storage units S1 and S2. A new FOUP 3 housing the unprocessed wafer W is transported from the mounting tables 4-3 to 4-8 to the stages 24-1 and 24-2 in which the wafer W is not placed. Besides, the mounting tables 4-3 to 4-8 of the storage units S1 and S2, in the same manner as stages 24-1 and 24-2, include a loading detection sensor that detects whether the FOUP 3 is mounted or not and whether the FOUP 3 is normally mounted. The loading detection sensor of each mounting table is electrically connected to the control unit 10-3.

In the FOUP transfer device 39 of the present embodiment, the top mounting tables 4-3 and 4-4 are used to send and receive the FOUP 3 to and from the OHT cart 11, and the remaining mounting tables 4-5 to 4-4 are used to temporarily store the FOUP 3. Therefore, the place where the FOUP 3 is placed can be changed as appropriate. Accordingly, even if arrival timing of the OHT cart 11 is delayed, the FOUP 3 can be supplied and removed to the load port 18-1 or 18-2 without waiting time.

Figure 17:
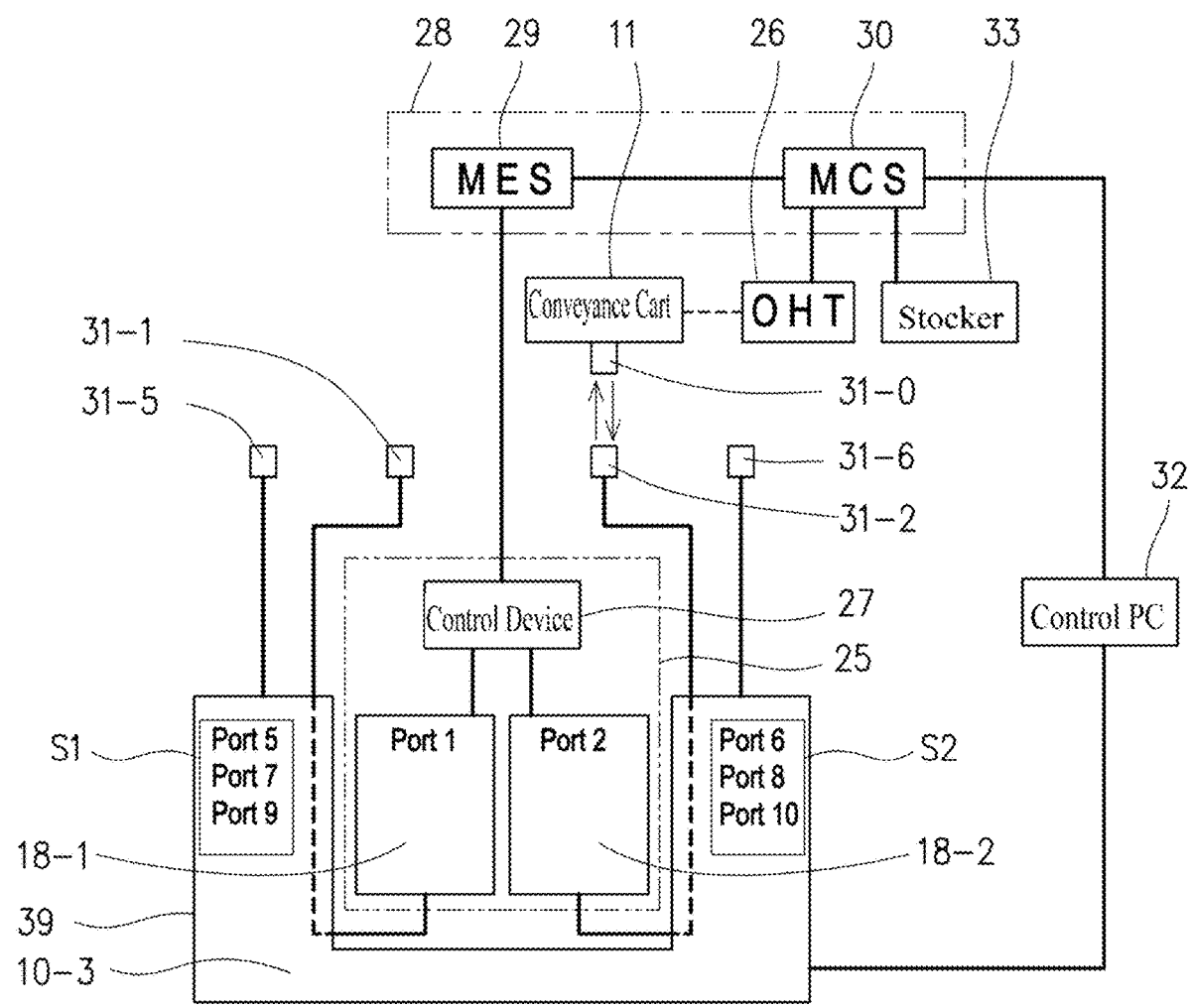
FIG. 17 is a block diagram showing a communication system after the FOUP transfer device of the present embodiment is added.
Figure 18:
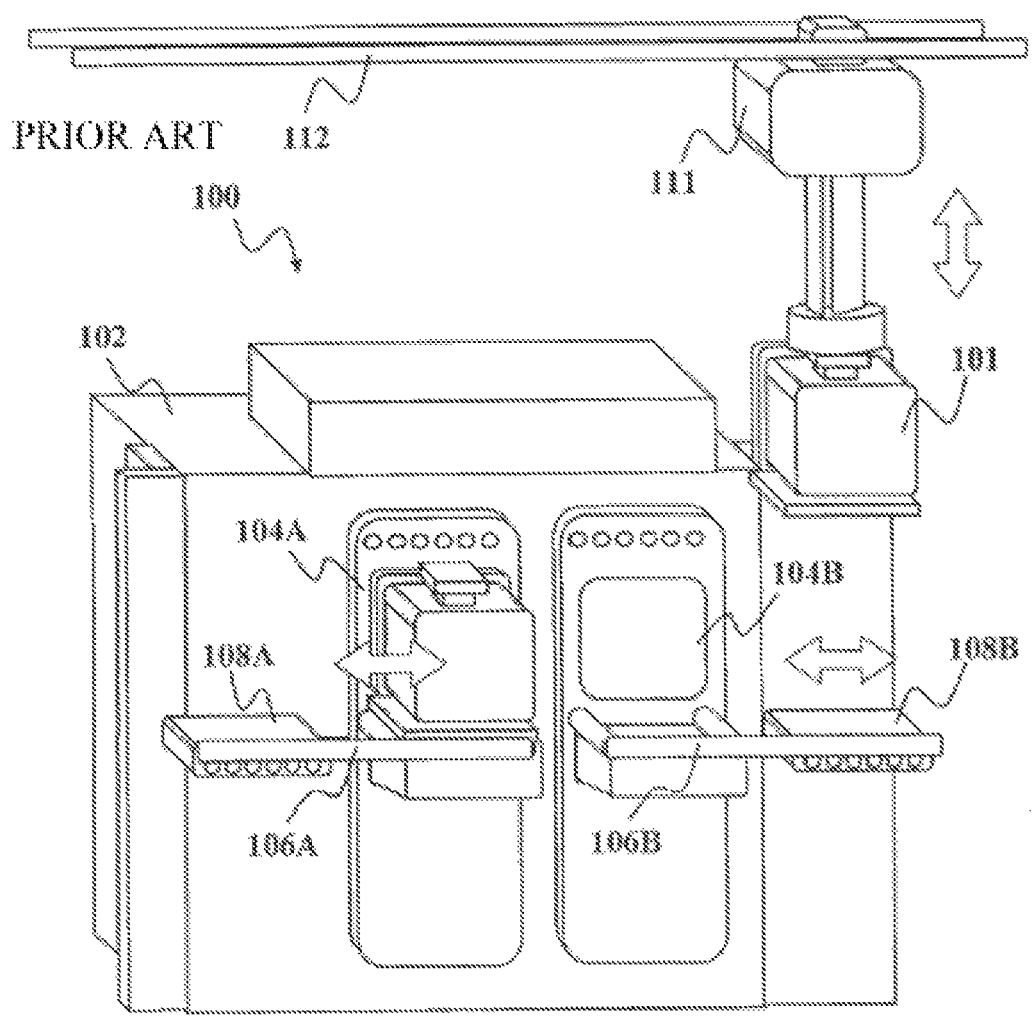
FIG. 18 shows a conventional FOUP transfer device.

The FOUP transfer device 39 of the present embodiment is provided with a control unit 10-3, and the control unit 10-3 controls the supply and removal of FOUP 3 to the stages 24-1 and 24-2, and each mounting table 4-5 to 4-8. Further, in addition to controlling exchanging the FOUP 3 to the top mounting table 4 with the OHT cart 11, the control unit 10-3 controls exchanging the FOUP 3 for the load ports 24-1 and 24-2 with the OHT cart 11 instead of the load ports 18-1 and 18-2 in the same manner as in the first and second embodiment. See FIG. 17. With the above configuration, it is possible to improve the productivity of the entire wafer processing apparatus while reducing the modification work for the already installed EFEM 25 as much as possible.

When the FOUP 3 conveyed by the OHT cart 11 is mounted on the load port 18-1 (Port 1) of the EFEM 25, the OHT cart 11 moves directly above the stage 24-1 of the load port 18-1 and sends a signal to the optical I/O communication device 31-1 via the optical I/O communication device 31-0 that requests mounting the second FOUP 3-2 before lowering the FOUP 3. The FOUP transfer device 39 that received this signal communicates with the load port 18-1, sends an allow (ACK) signal if the load port 18-1 is in a FOUP mountable state, and sends a disallow (NACK) signal to the OHT cart 11 via the first optical I/O communication device 31-1. When the OHT cart 11 receives the allow (ACK) signal from the FOUP transfer device 39, the hoist mechanism 11a is activated to mount the FOUP 3 on the stage 24-1 of the load port 18-1. The above-mentioned communication operation of the FOUP transfer device 39 is performed in the same manner for the load port 18-2 (Port 2), and the OHT cart 11 and the control unit 10-3 communicate with each other regarding the exchange of the FOUP 3 via the optical I/O communication device 31-2 corresponding to the load port 18-2. Further, the above-mentioned communication operation is performed not only when the FOUP 3 is mounted on the load ports 18-1 and 18-2 from the OHT cart 11 but also when the FOUP 3 mounted on the load ports 18-1 and 18-2 is transferred to the OHT cart 11.

Next, the operation when the FOUP 3 conveyed by the OHT cart 11 is mounted on the mounting tables 4-3 to 4-8 of the FOUP transfer device 39 will be described. When the FOUP 3 is exchanged between the OHT cart 11 and the FOUP transfer device 39, the mounting tables 4-3 and 4-4 disposed on the top of the storage units S1 and S2 disposed on the left and right among the plurality of mounting tables 4-3 to 4-8 included in the FOUP transfer device 39 are used. When the FOUP 3 conveyed by the OHT cart 11 is mounted on the top mounting table 4-3 (Port 5) of the storage unit S1 included in the FOUP transfer device 39, the OHT cart 11 moves directly above the mounting table 4-3 and sends a signal to the optical I/O communication device 31-5 via the optical I/O communication device 31-0 that requests mounting the FOUP 3 before lowering the FOUP 3. The FOUP transfer device 39 that received this signal confirms the signal of the FOUP 3 presence or absence sensor included in the mounting table 4-3, sends an allow (ACK) signal if the mounting table 4-3 is a FOUP mountable state, and sends a disallow (NACK) signal to the OHT cart 11 via the optical I/O communication device 31-5 if the mounting table 43 is in a non-mountable state. When the OHT cart 11 receives the allow (ACK) signal from the FOUP transfer device 39, the hoist mechanism 11a is operated to mount the FOUP 3 on the mounting table 4-3.

When it detects that the FOUP 3 is mounted on the mounting table 4-3, the control unit 10-3 operates the FOUP transfer mechanism 42, the horizontal drive mechanism 43, and the vertical drive mechanism 44 to transport the FOUP 3 to another mounting tables 4-4 to 4-6, or mount it on the mounting table 4-3 as it is. Then, when the FOUP 3 can be transported to the load ports 18-1 and 18-2, the FOUP 3 is transported to stage 24-1 or 24-2 on load port 18-1 or 18-2. The above-mentioned communication operation of the FOUP transfer device 39 is performed for the mounting table 4-4 (Port 8) arranged at the top stage of the storage unit S2 in the same manner, and the OHT cart 11 and the control unit 10-3 communicate with each other regarding the exchange of the FOUP 3 via the optical I/O communication device 31-6 corresponding to the mounting table 4-4. Further, the above communication operation is performed not only when the FOUP 3 is mounted on the mounting tables 4-3 and 4-4 from the OHT cart 11, but also when the FOUP 3 mounted on the mounting tables 4-3 and 4-4 is transferred to the OHT cart 11.

Although the present invention has been described in detail with respect to each embodiment, the present invention is not limited to these embodiments, and various modifications can be made without departing from the gist thereof. For example, the communication device included in the OHT cart 11 and the FOUP transfer device 1-1, 1-2, 34-1, 34-2, 39 is not limited to the optical I/O communication device 31-0 to 31-6. The present invention is also applicable to communication devices in accordance with wireless communication standards such as wireless LAN and Bluetooth (registered trademark). Further, instead of moving the FOUP 3 in an arc-shaped trajectory by the arm portion 7, it is also possible to move the FOUP 3 in various trajectories. Further, the number of mounting tables 4 provided in each of the storage units S1 and S2 can be increased or decreased as appropriate.

EXPLANATION OF REFERENCED NUMERALS 1, 1-1, 1-2 first FOUP transfer device
2 housing
3 FOUP
3a top flange
4, 4-1, 4-3~4-8 mounting table
5, 5-1, 5-2 FOUP transfer mechanism
6 holding portion
7, 7-1, 7-2, 7-3, 7-4 arm portion
8 arm drive mechanism
9 elevating mechanism
10, 10-1, 10-2, 10-3 control unit
11 conveyance cart
11a hoist mechanism
12 FOUP support pin
13 FOUP support member
14 air-cylinder
14a piston rod
15 driving source (stepping motor)
16 elevating table
17 linear actuator (driving source)
18, 18-1, 18-2 load port
19 caster
20 adjuster
21 manual switch
22 emergency stop switch
23 area sensor
24, 24-1, 24-2 stage
25 EFEM
26 OHT
26a track
26b second track
27 control device
28 host computer
29 MES
30 MCS
31, 31-0 to 30-6 optical I/O communication device
32 control PC
33 stocker
34, 34-1, 34-2 second FOUP transfer device
35 supply nozzle
36 exhaust nozzle
37 fixing member
38 RF receiver
39 third FOUP transfer device
40 frame
41 vertical plate
42 FOUP transfer mechanism
43 horizontal drive mechanism
C1, C2 rotation axis
W wafer F semiconductor manufacturing factory
S1, S2 storage unit

The invention claimed is:

1. A FOUP transfer device that is installed in a vicinity of a load port of a conveyance device having one or more load ports to transfer FOUPs (Front-Opening Unified Pod) to and from the load ports, comprising:
    a first communication device;
    said FOUP transfer device being connected to a second communication device included in the load port; and
    said FOUP transfer device performing communication between the load port and a third communication device included in an OHT conveyance carton on behalf of the load port.

2. The FOUP transfer device according to claim 1, further comprising a control PC that communicates with a host computer included in a semiconductor manufacturing factory.

3. The FOUP transfer device according to claim 1, wherein the FOUP transfer device further includes a communication means for exchanging FOUP transfer signals with the load port.

4. The FOUP transfer device according to claim 1, wherein the first communication device, the second communication device and the third communication device are optical I/O communication devices.

5. The FOUP transfer device according to claim 1, wherein an arrangement of the FOUP transfer devices matches an arrangement of a plurality of load ports included in the conveyance device, and these arrangements are located directly below an OHT track.

6. The FOUP transfer device according to claim 1, wherein an arrangement of the FOUP transfer devices does not match an arrangement of a plurality of load ports included in the conveyance device, and the FOUP transfer devices are located directly below a second OHT track different from a first OHT track.

7. The FOUP transfer device according to claim 1, further comprising:
    a mounting table on which the FOUP is mounted at a predetermined position;
    a holding portion that holds the FOUP mounted on the mounting table;
    an arm portion that moves the holding portion to a substantially arc-shaped trajectory; and
    an elevating mechanism that moves the arm portion up and down.

8. The FOUP transfer device according to claim 2, wherein the FOUP transfer device further includes a communication means for exchanging FOUP transfer signals with the load port.

9. The FOUP transfer device according to claim 2, wherein the first communication device, the second communication device and the third communication device are optical I/O communication devices.

10. The FOUP transfer device according to claim 3, wherein the first communication device, the second communication device and the third communication device are optical I/O communication devices.

11. The FOUP transfer device according to claim 2, wherein an arrangement of the FOUP transfer devices matches an arrangement of a plurality of load ports included in the conveyance device, and these arrangements are located directly below an OHT track.

12. The FOUP transfer device according to claim 3, wherein an arrangement of the FOUP transfer devices matches an arrangement of a plurality of load ports included in the conveyance device, and these arrangements are located directly below an OHT track.

13. The FOUP transfer device according to claim 4, wherein an arrangement of the FOUP transfer devices matches an arrangement of a plurality of load ports included in the conveyance device, and these arrangements are located directly below an OHT track.

14. The FOUP transfer device according to claim 2, wherein an arrangement of the FOUP transfer devices does not match an arrangement of a plurality of load ports included in the conveyance device, and the FOUP transfer devices are located directly below a second OHT track different from a first OHT track.

15. The FOUP transfer device according to claim 3, wherein an arrangement of the FOUP transfer devices does not match an arrangement of a plurality of load ports included in the conveyance device, and the FOUP transfer devices are located directly below a second OHT track different from a first OHT track.

16. The FOUP transfer device according to claim 4, wherein an arrangement of the FOUP transfer devices does not match an arrangement of a plurality of load ports included in the conveyance device, and the FOUP transfer devices are located directly below a second OHT track different from a first OHT track.

17. The FOUP transfer device according to claim 2, further comprising:
    a mounting table on which the FOUP is mounted at a predetermined position;
    a holding portion that holds the FOUP mounted on the mounting table;
    an arm portion that moves the holding portion to a substantially arc-shaped trajectory; and
    an elevating mechanism that moves the arm portion up and down.

18. The FOUP transfer device according to claim 3, further comprising:
    a mounting table on which the FOUP is mounted at a predetermined position;
    a holding portion that holds the FOUP mounted on the mounting table;
    an arm portion that moves the holding portion to a substantially arc-shaped trajectory; and
    an elevating mechanism that moves the arm portion up and down.

19. The FOUP transfer device according to claim 4, further comprising:
    a mounting table on which the FOUP is mounted at a predetermined position;
    a holding portion that holds the FOUP mounted on the mounting table;
    an arm portion that moves the holding portion to a substantially arc-shaped trajectory; and
    an elevating mechanism that moves the arm portion up and down.

20. The FOUP transfer device according to claim 5, further comprising:
    a mounting table on which the FOUP is mounted at a predetermined position;
    a holding portion that holds the FOUP mounted on the mounting table;
    an arm portion that moves the holding portion to a substantially arc-shaped trajectory; and
    an elevating mechanism that moves the arm portion up and down.

* * * * *